(12) United States Patent
Hashimoto et al.

(10) Patent No.: US 10,476,237 B2
(45) Date of Patent: Nov. 12, 2019

(54) QUANTUM CASCADE LASER

(71) Applicant: SUMITOMO ELECTRIC INDUSTRIES, LTD., Osaka (JP)

(72) Inventors: Jun-ichi Hashimoto, Osaka (JP); Hiroyuki Yoshinaga, Osaka (JP); Yukihiro Tsuji, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/011,893

(22) Filed: Jun. 19, 2018

(65) Prior Publication Data

US 2018/0375295 A1   Dec. 27, 2018

(30) Foreign Application Priority Data

Jun. 22, 2017   (JP) ................................ 2017-122339
Jun. 27, 2017   (JP) ................................ 2017-125264

(51) Int. Cl.
*H01S 5/34*       (2006.01)
*H01S 5/02*       (2006.01)
(Continued)

(52) U.S. Cl.
CPC .......... *H01S 5/3402* (2013.01); *H01S 5/0071* (2013.01); *H01S 5/0203* (2013.01);
(Continued)

(58) Field of Classification Search
CPC ....... H01S 5/3401–5/3402; H01S 5/16–5/168; H01S 5/22–5/24; H01S 5/0226;
(Continued)

(56) References Cited

U.S. PATENT DOCUMENTS 4,751,710 A * 6/1988 Yamaguchi ........... H01S 5/0264
                                                 372/44.01
5,180,685 A * 1/1993 Yamamoto .......... H01L 33/0062
                                                 148/DIG. 72
(Continued)

FOREIGN PATENT DOCUMENTS

DE   102008045980 A1 *  6/2010  ............. B82Y 20/00
DE   102015116335 A1 *  3/2017  ........... H01S 5/0421

OTHER PUBLICATIONS

S.R. Darvish, et al., "High-power, continuous-wave operation of distributed-feedback quantum-cascade lasers at $\lambda$ 7.8 $\mu m$" *Applied Physics Letters* 89, 251119 (2006).
(Continued)

*Primary Examiner* — Joshua King
(74) *Attorney, Agent, or Firm* — Smith, Gambrell & Russell, LLP.

(57) ABSTRACT

A quantum cascade laser includes: a substrate having a principal surface, a back surface, and a substrate end face, the substrate end face extending along a reference plane intersecting a second direction which intersects the first direction; a semiconductor laminate having a laminate end face extending along the reference plane; a first electrode disposed on the semiconductor laminate; a second electrode disposed on the substrate; a first insulating film disposed on the laminate end face and the first electrode; a metal film disposed on the first insulating film, the laminate end face, the substrate end face, and the second electrode; and a second insulating film disposed on the first electrode, the second insulating film having a part on the first electrode between the metal film and the semiconductor laminate. On the first electrode, the second insulating film has a thickness larger than that of the first insulating film.

9 Claims, 17 Drawing Sheets

(51) Int. Cl.
  *H01S 5/042* (2006.01)
  *H01S 5/12* (2006.01)
  *H01S 5/00* (2006.01)
  *H01S 5/028* (2006.01)
  *H01S 5/227* (2006.01)
  *H01S 5/40* (2006.01)
  *H01S 5/22* (2006.01)
  *B82Y 20/00* (2011.01)
  *H01S 5/022* (2006.01)
  *H01S 5/343* (2006.01)

(52) U.S. Cl.
  CPC .......... *H01S 5/0216* (2013.01); *H01S 5/0287* (2013.01); *H01S 5/0425* (2013.01); *H01S 5/12* (2013.01); *H01S 5/1237* (2013.01); *H01S 5/2224* (2013.01); *H01S 5/2275* (2013.01); *H01S 5/4031* (2013.01); *B82Y 20/00* (2013.01); *H01S 5/0202* (2013.01); *H01S 5/02272* (2013.01); *H01S 5/1231* (2013.01); *H01S 5/34366* (2013.01); *H01S 2301/163* (2013.01)

(58) Field of Classification Search
  CPC .... H01S 5/028–5/0288; H01S 5/02272; H01S 5/02236–5/02276; H01S 5/02469; H01S 5/02484; H01S 5/02476; H01S 5/02492
  See application file for complete search history.

(56) References Cited

U.S. PATENT DOCUMENTS

| | | | | |
|---|---|---|---|---|
| 5,677,922 | A * | 10/1997 | Hayafuji | B82Y 20/00 372/46.01 |
| 5,943,553 | A * | 8/1999 | Spaeth | H01L 33/641 372/107 |
| 6,289,030 | B1 * | 9/2001 | Charles | H01L 31/02161 257/437 |
| 6,326,646 | B1 * | 12/2001 | Baillargeon | B82Y 20/00 257/94 |
| 6,355,505 | B1 | 3/2002 | Maeda et al. | |
| 6,647,047 | B2 * | 11/2003 | Yokota | H01S 5/0281 372/49.01 |
| 6,710,375 | B2 | 3/2004 | Oshima | |
| 9,184,563 | B1 * | 11/2015 | Raring | H01S 5/2201 |
| 2003/0035453 | A1 * | 2/2003 | Fitz | H01S 5/028 372/49.01 |
| 2004/0101013 | A1 * | 5/2004 | Yokota | H01S 5/028 372/46.013 |
| 2004/0233950 | A1 * | 11/2004 | Furukawa | H01S 5/028 372/43.01 |
| 2004/0238810 | A1 | 12/2004 | Dwilinski et al. | |
| 2005/0151150 | A1 * | 7/2005 | Choi | H01S 5/0425 257/99 |
| 2006/0239321 | A1 * | 10/2006 | Kume | B82Y 20/00 372/50.121 |
| 2006/0274804 | A1 * | 12/2006 | Behfar | H01S 5/028 372/49.01 |
| 2009/0067464 | A1 * | 3/2009 | Tanaka | B82Y 20/00 372/45.011 |
| 2009/0086782 | A1 | 4/2009 | Yokoyama et al. | |
| 2013/0028280 | A1 * | 1/2013 | Hongo | H01S 5/02461 372/44.01 |
| 2013/0107534 | A1 * | 5/2013 | Avramescu | H01S 5/02461 362/259 |
| 2013/0250994 | A1 | 9/2013 | Moenster et al. | |
| 2013/0301666 | A1 * | 11/2013 | Stagarescu | H01S 5/3013 372/44.01 |
| 2013/0322480 | A1 | 12/2013 | Edamura et al. | |
| 2014/0211819 | A1 * | 7/2014 | Yoshida | H01S 5/02272 372/36 |
| 2014/0239250 | A1 * | 8/2014 | Fang | H01L 33/06 257/13 |
| 2014/0348196 | A1 * | 11/2014 | Yoshinaga | H01S 5/3401 372/45.01 |
| 2015/0117484 | A1 | 4/2015 | Sugiyama et al. | |
| 2018/0069374 | A1 | 3/2018 | Kakuno et al. | |

OTHER PUBLICATIONS

Manijeh Razeghi, "High-Performance InP-Based Mid-IR Quantum Cascade Lasers", *IEEE Journal of Selected Topics in Quantum Electronics*, vol. 15, No. 3, p. 941-p. 951 May/Jun. 2009.
Non-Final Office Action dated Jan. 11, 2019 in U.S. Appl. No. 16/006,708.
Notice of Allowance for U.S. Appl. No. 16/006,666 dated Jan. 11, 2019.
Office Action for U.S. Appl. No. 16/011,818 dated Mar. 20, 2019.
Notice of Allowance for U.S. Appl. No. 16/006,666 dated Apr. 13, 2019.
Notice of Allowance for U.S. Appl. No. 16/006,666 dated Apr. 3, 2019.

* cited by examiner

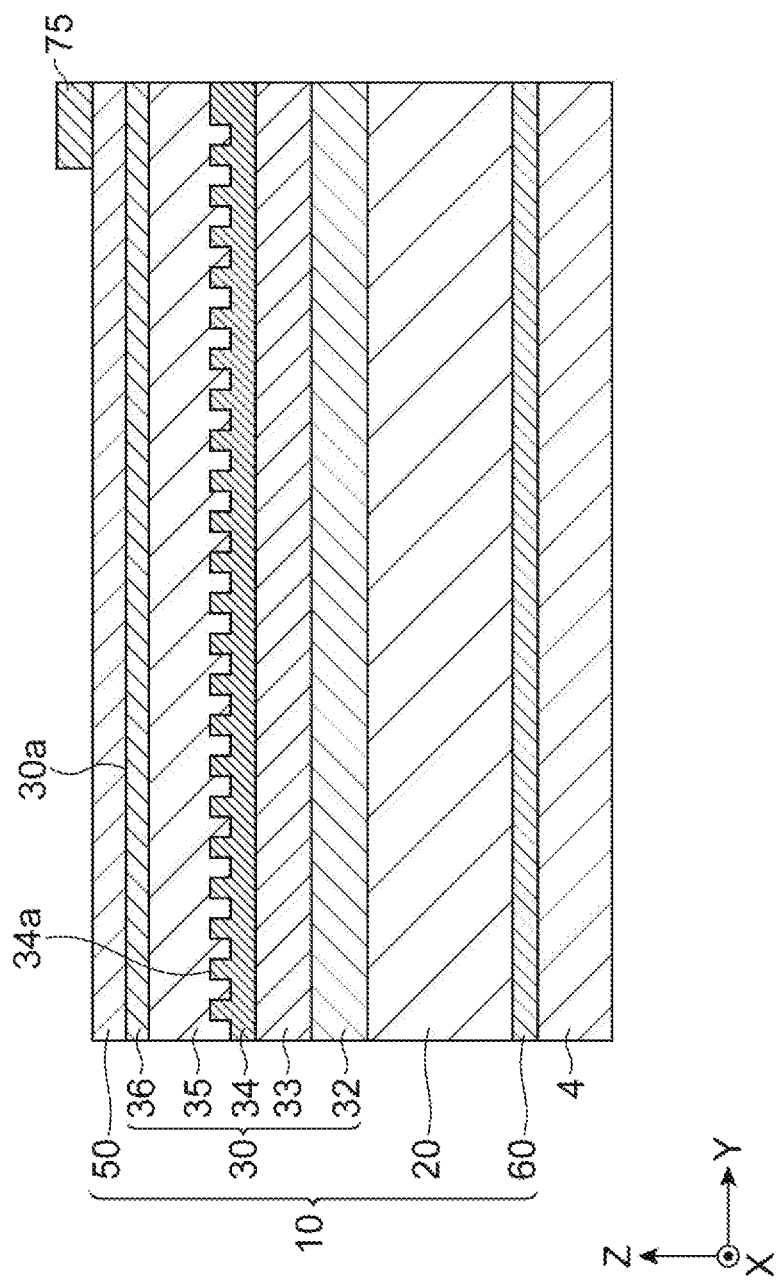

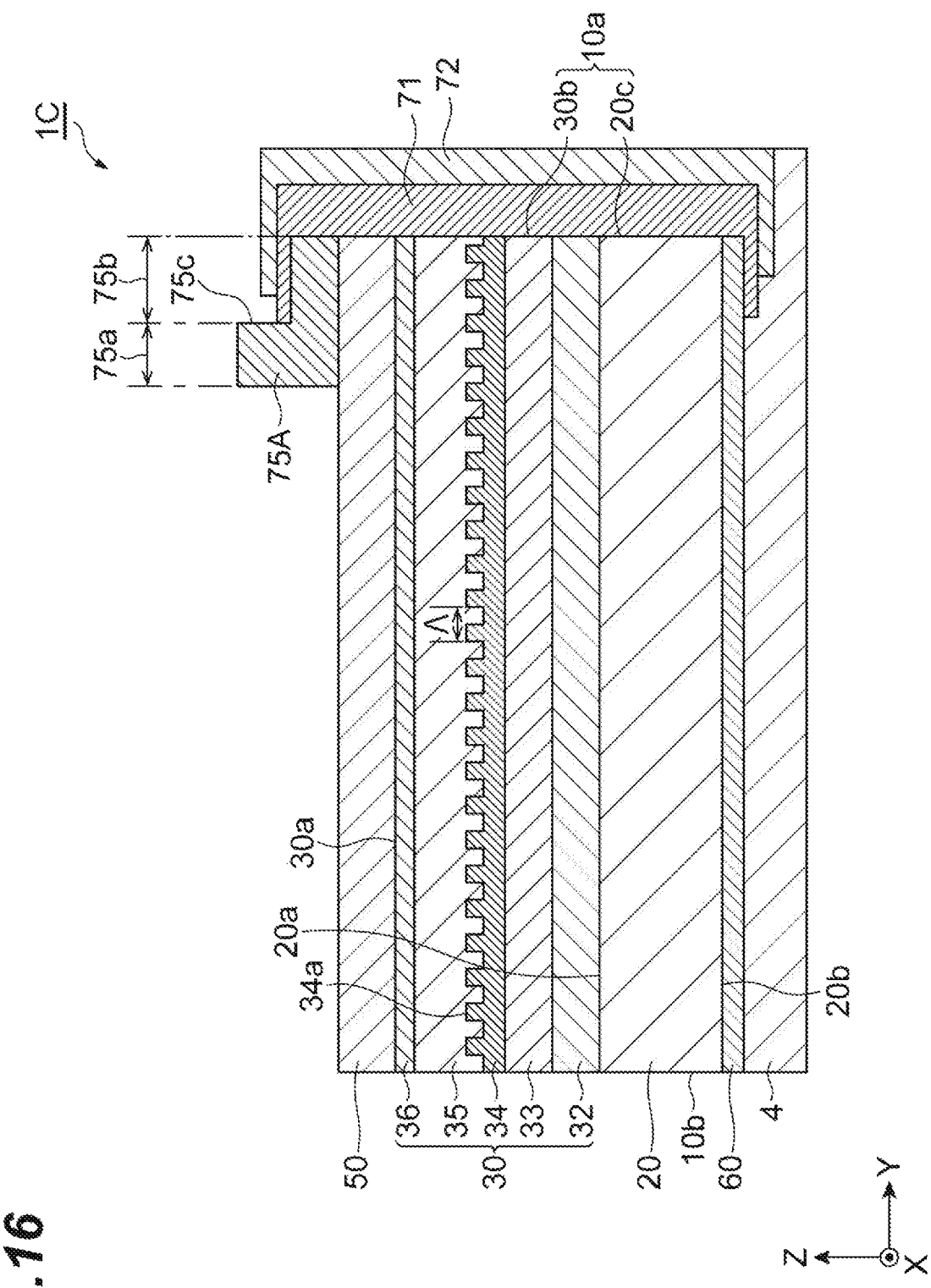

QUANTUM CASCADE LASER

BACKGROUND OF THE INVENTION

Field of the Invention

The present invention relates to a quantum cascade laser. This application claims the benefit of priorities from Japanese Patent Application No. 2017-122339 filed on Jun. 22, 2017 and Japanese Patent Application No. 2017-125264 filed on Jun. 27, 2017, which are herein incorporated by reference in their entirety.

Related Background Art

Non-Patent Document (S. R. Darvish, et al. "High-power, continuous-wave operation of distributed-feedback quantum-cascade lasers at λ 7.8 µm", Applied Physics Letters 89, 251119, 2006) discloses a quantum cascade laser.

SUMMARY OF THE INVENTION

A quantum cascade laser according to one aspect of the present invention includes: a substrate including a principal surface, an back surface, and a substrate end face, the principal surface and the back surface being arranged in a first direction, the principal surface being opposite to the back surface, the substrate end face extending along a reference plane intersecting a second direction, and the second direction intersecting the first direction; a semiconductor laminate disposed on the principal surface of the substrate, the semiconductor laminate having a laminate end face, and the semiconductor laminate including a core layer extending from the laminate end face in the second direction, and a cladding layer disposed on the core layer, and the laminate end face extending along the reference plane; a first electrode disposed on the semiconductor laminate, the semiconductor laminate being disposed between the first electrode and the substrate; a second electrode disposed on the back surface of the substrate; a first insulating film disposed on the laminate end face, the substrate end face, and the first electrode; a metal film disposed on the first insulating film, the laminate end face, the substrate end face, and the first electrode; and a second insulating film disposed on the first electrode, the second insulating film having a part on the first electrode, and the part of the second insulating film being between the metal film and the semiconductor laminate. On the first electrode, the second insulating film has a thickness in the first direction larger than that of the first insulating film.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

FIG. 7 is a schematic view showing a major process in the method according to the embodiment.

FIG. 16 is a cross-sectional view showing the quantum cascade semiconductor laser according to still another embodiment.

DESCRIPTION OF THE EMBODIMENTS

Figure 1:
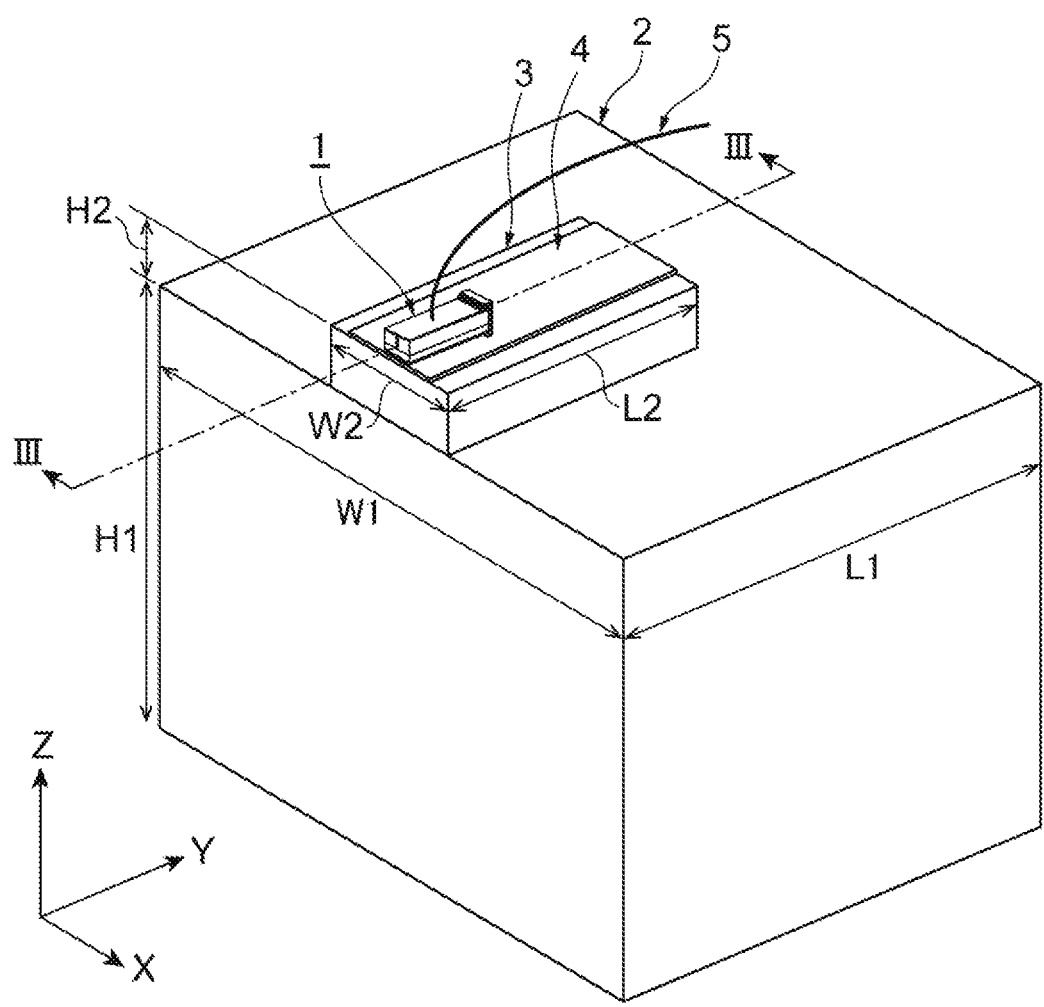
FIG. 1 is a perspective view showing a quantum cascade semiconductor laser, which is die-bonded, according to an embodiment.

A quantum cascade laser includes a lower electrode, a semiconductor substrate, a semiconductor laminate, and an upper electrode, which are arranged to form a device structure. The quantum cascade laser further has a metal film for the lasing cavity, and an insulating film on the end face with the insulating film disposed between the metal film and the end face. The insulating film is made of $SiO_2$, and the metal film is made of gold (Au). This quantum cascade laser is mounted on an electronic component with solder material.

The quantum cascade laser is provided with the laser cavity associated with the end face, and may have a reflection film made of a metal film, which is formed on the end face, making the reflectance at the end face enhanced. A metal film making direct contact with the end face, which includes end faces of semiconductor layers of the semiconductor device, causes short-circuit at the end face. The quantum cascade laser is provided with an insulating film, which is disposed between the end face and the metal film, to separate the metal film from the end face. The insulating and metal films are sequentially formed on the end face by supplying respective raw materials toward the end face. In forming these films, a part of the raw materials thereof misses the end face to fly along the upper and lower electrodes, thereby forming deposited materials on these electrodes, so that the quantum cascade laser is provided with the insulating and metal films on the end face. This quantum cascade laser can be mounted on the electronic component, for example, with solder material, so that the deposited metallic material on the lower electrode comes in contact with the solder material. Mounting the quantum cascade laser on the electronic component results in that the solder material connects the lower electrode to the metallic deposited material, so that the metallic deposited material receives a high voltage (for example, a voltage of 10 volts or more) applied between the upper and lower electrodes for lasing. The high voltage is applied to the metal film. This high voltage on the metal film is finally applied to the insulating film between the upper electrode and the deposited metallic material on the upper electrode.

The deposited material for the insulating film, however, has an extremely small thickness on the upper electrode, which is smaller than (as small as, for example, about one severalth of) that of the insulating film on the end face. The application of a high voltage, for example, 10 volts or more, to the extremely thin deposited material for the insulating film, which is between the upper electrode and the metal film on the upper electrode, may break down the extremely thin deposited material in the vicinity of the end face to form a broken-down portion, so that a large amount of current (referred to as inrush current) flows through the broken-down portion in the deposited material, leading to a failure, such as breakdown of the end face, in the quantum cascade laser.

Forming a thick deposited material on the upper electrode makes a thickness of the insulating film on the end face large (for example, a thickness several times larger than the target thickness). Forming the thick insulating film makes a deposition time long, resulting in reduction in the productivity of the quantum cascade laser. Further, the thick insulating film on the end face may produce an additional stress to the end face, resulting in deterioration of the end face in quality, such as occurrence of cracking and/or peeling of the insulating film.

It is an object of the one aspect of the present invention to provide a quantum cascade laser, which has an insulating film and a metal film stacked on an end face, capable of reducing the occurrence of break-down of the insulating film.

A description will be given of embodiments according to the above aspect below.

A quantum cascade laser according to an embodiment includes: (a) a substrate having a principal surface, an back surface, and a substrate end face, the principal surface and the back surface being arranged in a first direction, the principal surface being opposite to the back surface, the substrate end face extending along a reference plane intersecting a second direction, and the second direction intersecting the first direction; (b) a semiconductor laminate disposed on the principal surface of the substrate, the semiconductor laminate having a laminate end face, and the semiconductor laminate including a core layer extending from the laminate end face in the second direction, and a cladding layer disposed on the core layer, the laminate end face extending along the reference plane; (c) a first electrode disposed on the semiconductor laminate, the semiconductor laminate being disposed between the first electrode and the semiconductor substrate; (d) a second electrode disposed on the back surface of the substrate; (e) a first insulating film disposed on the laminate end face and the first electrode; (f) a metal film disposed on the first insulating film, the laminate end face, the substrate end face, and the second electrode; and (g) a second insulating film disposed on the first electrode, the second insulating film having a portion on the first electrode, and the portion of the second insulating film being between the metal film and the semiconductor laminate. On the first electrode, the second insulating film has a thickness in the first direction larger than that of the first insulating film.

The quantum cascade laser is provided with the second insulating film, the thickness of which is larger than that of the first insulating film, between the first electrode and the metal film arranged in the first direction to allow an insulating region (the first and second insulating films) to have a desired thickness, so that the first and second insulating films makes an insulating property between the first electrode and the metal film enhanced. The quantum cascade laser allows the insulating region to endure a high voltage applied between the metal film and the first electrode, thereby preventing the quantum cascade laser from being subject to failures in the end face, such as break-down of insulating films.

In the quantum cascade laser according to an embodiment, the principal surface has a first area and a second area; the first area and the second area of the principal surface are arranged in the second direction; the second area of the principal surface is disposed between the laminate end face and the first area of the principal surface; the first electrode has a first thickness on the first area of the principal surface and a second thickness on the second area of the principal surface; and in the first electrode, the second thickness is smaller than the first thickness.

In the quantum cascade laser according to an embodiment, the principal surface has a first area and a second area; the first area and the second area of the principal surface are arranged in the second direction; the second area of the principal surface is disposed between the laminate end face and the first area of the principal surface; and the first electrode has an end apart from the laminate end face and the second area of the principal surface.

The first electrode, which has a partly thinned portion in thickness, enables an easy cleavage in the fabrication of the quantum cascade laser. The method of fabricating the quantum cascade laser can conduct cleavage to form the laminate end face and the substrate end face with an excellent yield. In the first electrode, the second thickness on the second area of the semiconductor laminate is smaller than the first thickness on the first area of the semiconductor laminate. This first electrode has a first sheet resistance in the first portion of the first thickness and a second sheet resistance, larger than the first sheet resistance, in the second portion of the second thickness. This high sheet resistance can reduce a leakage current flowing in the vicinity of the substrate end face and the laminate end face, thereby improving the device performances (such as, the threshold current) of the quantum cascade laser.

In the quantum cascade laser, the first electrode is disposed on the first area of the semiconductor laminate, and is not disposed on the second area of the semiconductor laminate, thereby providing the quantum cascade laser with the same advantageous effects as the above structure.

In the quantum cascade laser according to an embodiment, the back surface has a first area and a second area; the first area and the second area of the back surface are arranged in the second direction; the second area of the back surface is disposed between the substrate end face and the first area of the back surface; the second electrode has a first thickness on the first area of the back surface and a second thickness on the second area of the back surface; and in the second electrode, the second thickness is smaller than the first thickness.

In the quantum cascade laser according to an embodiment, the back surface has a first area and a second area; the first area and the second area of the back surface are arranged in the second direction; the second area of the back surface is disposed between the substrate end face and the first area of the back surface; and the second electrode has an end apart from the substrate end face and the second area of the back surface.

The second electrode, which has a partly thinned portion in thickness, enables an easy cleavage in the method for fabricating the quantum cascade laser. The fabrication of the quantum cascade laser can conduct cleavage to form the laminate end face and the substrate end face with an excellent yield. In the second electrode, the second thickness on the second area of the substrate is smaller than the first thickness on the first area of the substrate. This second electrode has a first sheet resistance in the first portion of the first thickness and a second sheet resistance, larger than the first sheet resistance, in the second portion of the second thickness. This high sheet resistance can reduce a leakage current flowing in the vicinity of the substrate end face and the laminate end face, thereby improving the device performances (such as, the threshold current) of the quantum cascade laser.

In the quantum cascade laser, the second electrode is disposed on the first area of the back surface, and is not disposed on the second area of the back surface, thereby providing the quantum cascade laser with the same advantageous effects as the above structure.

In the quantum cascade laser according to an embodiment, the second insulating film includes a first portion and a second portion arranged in the second direction, the second portion extends from the laminate end face to the first portion of the second insulating film; the second insulating film has a first thickness in the first portion thereof and a second thickness in the second portion thereof; and in the second insulating film, the first thickness is smaller than the second thickness.

The difference in thickness of the second insulating film forms a stepped portion at the boundary between the first and second portions. In the fabrication of the quantum cascade laser, the stepped portion can bounce back metal particles for the metal layer to terminate the metal film at the boundary. Terminating the metal film at the stepped portion prevents short-circuit from occurring between the metal film and the first electrode, thereby reducing the occurrence of device failures associated with the short circuit.

In the quantum cascade laser according to an embodiment, the first insulating film includes at least one of $SiO_2$, SiON, SiN, alumina, a BCB resin, or a polyimide resin. In the quantum cascade laser according to an embodiment, the second insulating film includes at least one of $SiO_2$, SiON, SiN, alumina, a BCB resin, or a polyimide resin. These materials can provide the insulating film of the quantum cascade semiconductor laser with an excellent durability and insulating properties, and allows the insulating film to work as a protective film for the laminate end face and the substrate end face. Films of the above materials can be formed on the laminate end face and the substrate end face using a dielectric film deposition, such as sputtering, CVD or spin coating. Forming the insulating film can be introduced into the process for fabricating a quantum cascade semiconductor laser.

In the quantum cascade laser according to an embodiment, the metal film includes an Au film. Using the Au film as the reflective film can provide the quantum cascade semiconductor laser with a high reflectance exceeding, for example, 90 percent at the laminate end face and the substrate end face.

In the quantum cascade laser according to an embodiment, the cladding layer includes InP. InP is a binary crystal lattice-matched to an InP base, which allows the satisfactory crystal-growth of the InP layer on the InP substrate. InP has an excellent thermal conductivity, and allows the cladding layer of InP to dissipate heat from the core layer. Using InP for the cladding layer can provide the quantum cascade laser with excellent temperature characteristics.

In the quantum cascade laser according to an embodiment, the core layer includes active layers each working as a light emitting region and injection layers each enabling injection of carriers into the active layer, and the active layers and the injection layers are alternately arranged in the first direction. The alternate arrangement of the active and injection layers allows an injection layer in the core layer to continuously and smoothly inject electrons therein into the active layer adjacent thereto and allows the adjacent active layer to emit light by subband transition in the conduction band, so that the cascading of the injection and the subband transition in the core allows the quantum cascade semiconductor laser to produce laser light, thereby enhancing the lasing characteristics.

In the quantum cascade laser according to an embodiment, each of the active layers and the injection layers includes a superlattice of GaInAs/AlInAs. The active and injection layers of GaInAs/AlInAs superlattices allow the core layer to lase in mid-infrared wavelengths (e.g., 3 to 20 micrometers) by means of electron transition between subbands in the conduction band.

The quantum cascade laser according to an embodiment, the semiconductor substrate includes an InP base. The quantum cascade semiconductor laser capable of producing light in mid-infrared region has a semiconductor laminate having lattice constants close to that of InP. Using the InP base as the semiconductor substrate allows the growth of the semiconductor laminate on the semiconductor substrate with excellent crystal quality. Further, the semiconductor substrate of InP, which is transparent to light in mid-infrared wavelengths, can function as a cladding layer.

Teachings of the present invention can be readily understood by considering the following detailed description with reference to the accompanying drawings shown as examples. Referring to the accompanying drawings, embodiments of a quantum cascade laser, and a method for fabricating a quantum cascade laser according to the present invention will be described below. To facilitate understanding, identical reference numerals are used, where possible, to designate identical elements that are common to the figures.

FIG. 1 is a perspective view showing a quantum cascade laser 1 according to an embodiment is mounted. For easy understanding, an XYZ coordinate system is depicted in FIG. 1, and in the present embodiment X-, Y-, and Z-axes are orthogonal to each other. The quantum cascade laser 1 may have a distributed feedback type (DFB), which allows the quantum cascade laser 1 to lase in a single mode, for example, in mid-infrared wavelengths of 3 to 20 micrometers. As shown in FIG. 1, the quantum cascade laser 1 is mounted on an electronic component, such as a submount 3, which is located on a carrier 2, with a solder material 4. Specifically, the quantum cascade laser 1 is die-bonded to the submount 3 with the solder material 4 in an epi-up manner (with the epi-surface upward). The quantum cascade laser 1 has a lower electrode, which is electrically connected to the carrier 2 with the submount 3 and the solder material 4, and has an upper electrode, which is connected to an end of a wiring conductor 5. The wiring conductor 5 reaches a bonding pad to feed power to the quantum cascade laser 1. The upper electrode of the quantum cascade laser 1 is electrically connected to the pad electrode on the submount through the wiring conductor 5. The carrier 2 and the pad electrode are electrically connected to an external power supply. The application of a voltage from the external power supply between the upper and lower electrodes of the quantum cascade laser 1 turns on the quantum cascade laser 1 to cause current to flow into the quantum cascade laser 1, so that the quantum cascade laser 1 emits lasing light.

The carrier 2 has a width W1 in a range of, for example, 4 to 8 mm in the X direction and a length L1 in a range of, for example, 4 to 8 mm in the Y direction, and the carrier 2 has a thickness H1 in, for example, a range of 1 to 8 mm in the Z direction. The submount 3 has a length W2 in a range of, for example, 1 to 4 mm in the X direction and a length L2 in a range of 2 to 4 mm in the Y direction, and has a thickness H2 in a range of, for example, 0.1 to 0.5 mm in the Z direction. The submount 3 may include AlN or CuW, and the carrier 2 may include Cu or CuW. The solder material 4 may include AuSn, indium (In) or silver paste, and the wiring conductor 5 may include Au.

Figure 2:
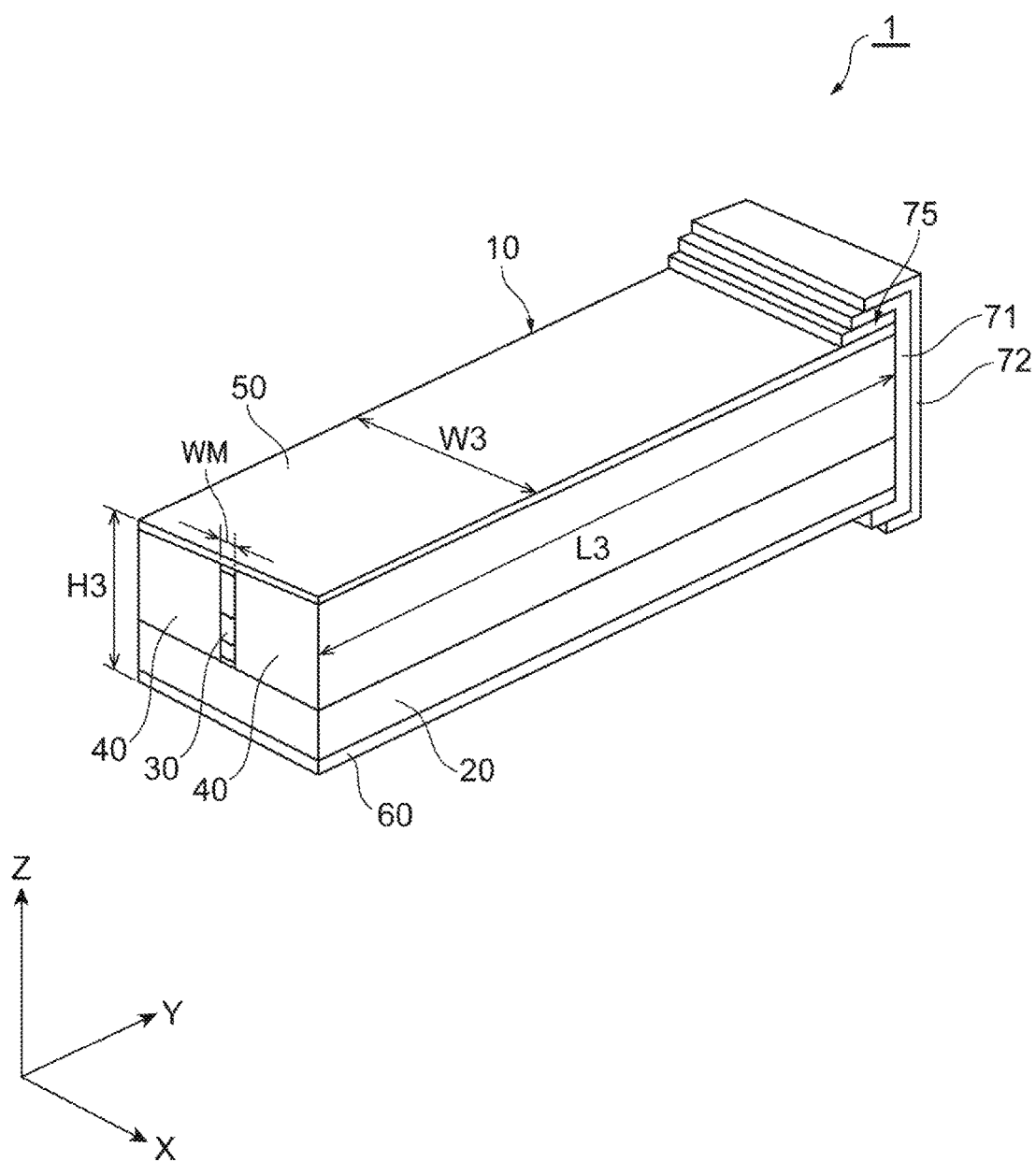
FIG. 2 is a perspective view showing the quantum cascade semiconductor laser shown in FIG. 1.
Figure 3:
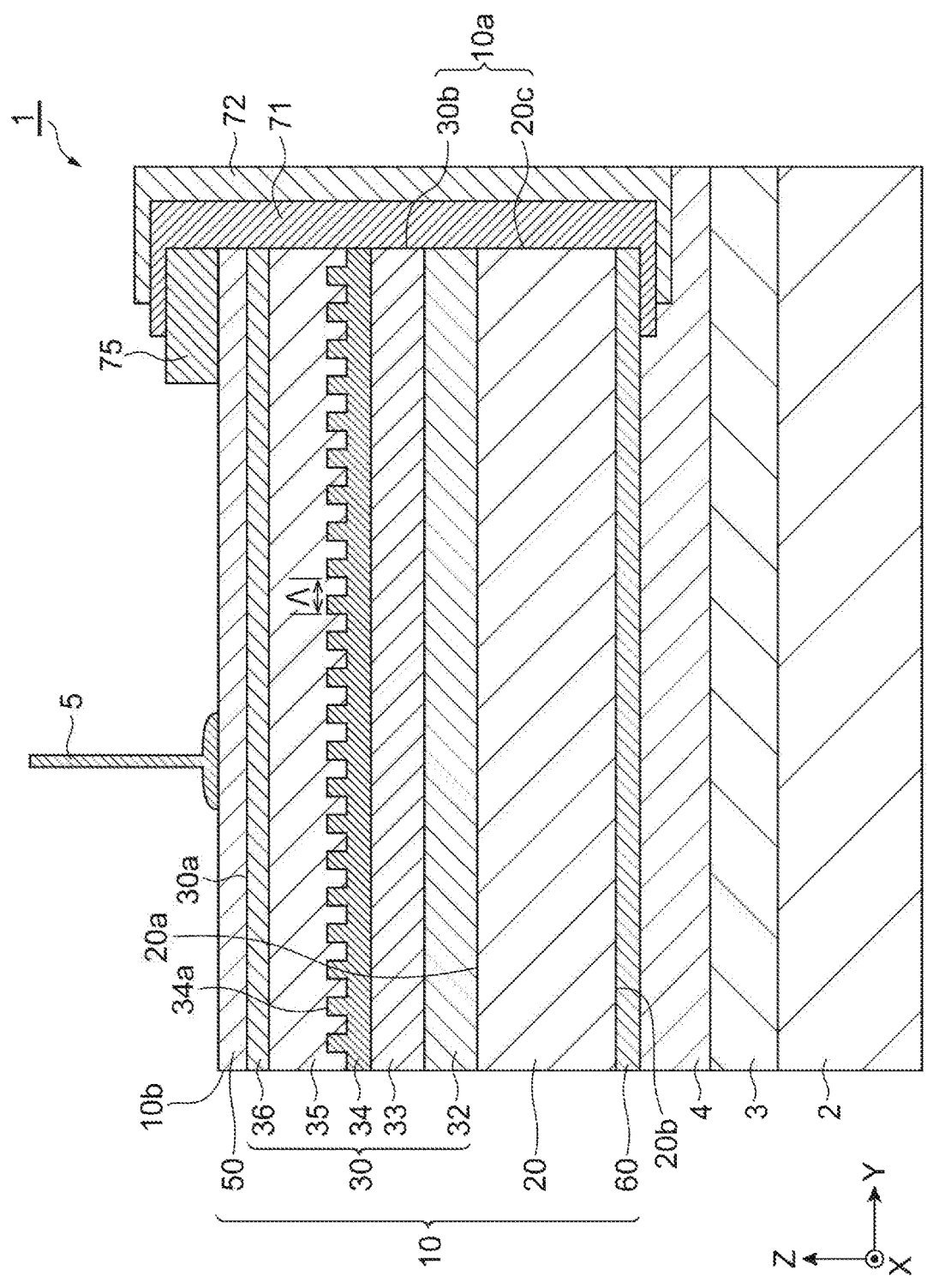
FIG. 3 is a cross-sectional view taken along line III-III shown in FIG. 1.

FIG. 2 is a perspective view showing the quantum cascade laser 1 shown in FIG. 1. FIG. 3 is a cross sectional view taken along line III-III shown in FIG. 1. As shown in FIGS. 2 and 3, the quantum cascade laser 1 includes a semiconductor device portion 10, an insulating film 71, and a metal film 72 (a first metal film). The semiconductor device portion 10 has a buried-heterostructure (BH) enabling confinement of current, which is referred to as a current confinement structure. The semiconductor device portion 10 has a strip-shaped mesa, extending in a direction in which the waveguide mesa extends (e.g., in the Y direction). The semiconductor device portion 10 has a length L3 in a range of, for example, 1 to 3 mm in the Y direction; a length W3 in a range of, for example, 400 to 800 micrometers in the X direction; and a length H3 (the thickness of the semiconductor device portion 10) in a range of, for example, 100 to 200 micrometers. The semiconductor device portion 10 has a rear end face 10a and a front end face 10b, which are opposite to each other in the Y direction. Further, the semiconductor device portion 10 includes a semiconductor substrate 20, a semiconductor laminate 30, two current block portions 40, an upper electrode 50 (referred to as a first electrode), and a lower electrode 60 (referred to as a second electrode).

As shown in FIG. 3, the quantum cascade laser 1 is mounted on the submount 3 such that the semiconductor substrate 20 is bonded to the submount 3 with the solder material 4. The semiconductor substrate 20 may be, for example, an n-type InP substrate. The semiconductor substrate 20 is conductive to allow current to flow through the semiconductor laminate 30 in applying a voltage across the upper and lower electrodes 50 and 60. In order to allow the quantum cascade laser 1 to use electrons used as a carrier, the semiconductor substrate 20 has an n-type conductivity. The semiconductor substrate 20 can work as a lower cladding region with respect to the core layer 33. Alternatively, the quantum cascade laser has a lower cladding layer between the semiconductor substrate 20 and the core layer 33, and does not require the semiconductor substrate 20 to work as a lower cladding region. The semiconductor substrate 20 includes a principal surface 20a, a back surface 20b, and a substrate end face 20c. The principal and back surfaces 20a and 20b are opposite to each other (in the Z direction). The principal and back surfaces 20a and 20b of the semiconductor substrate 20, and the submount 3 are arranged in order, for example, in the Z direction. The semiconductor substrate 20 has a thickness of, for example, 100 micrometers in the Z direction (defined as a distance between the principal and back surfaces 20a and 20b) in the Z direction. The substrate end face 20c intersects an axis extending, for example, in the Y direction (the second direction), and connects the principal and back surfaces 20a and 20b to each other. The substrate end face 20c is included by the rear end face 10a.

The semiconductor laminate 30 is disposed on the principal surface 20a of the semiconductor substrate 20. The semiconductor laminate 30 has an upper face 30a, which is oriented in a direction of an axis extending, for example, in the Z direction; a laminate end face 30b, which is oriented in a direction of an axis extending, for example, in the Y direction; and a bottom face, which is in contact with the principal surface 20a and is opposite to the upper face 30a. The laminate end face 30b and the substrate end face 20c are arranged along a reference plane. The rear end face 10a includes the laminate end face 30b of the semiconductor laminate 30 in addition to the substrate end face 20c. The semiconductor laminate 30 has a mesa shape. The semiconductor laminate 30 has a strip-shape, which extends, for example, in the Y direction, with a width WM defined in the X direction, and is located apart from the sides of the quantum cascade laser 1 in the X direction. The semiconductor laminate 30 includes end faces, which are opposite to each other in the Y direction, and side faces, which are opposite to each other in the X direction. The end faces of the semiconductor laminate 30, serving as mirrors, for the laser cavity of the quantum cascade laser 1. One of the end faces is included in the laminate end face 30b. The semiconductor laminate 30 includes a buffer layer 32, a core layer 33, a diffraction grating layer 34, an upper cladding layer 35, and a contact layer 36, which are sequentially arranged on the semiconductor substrate 20.

The buffer layer 32 and the upper cladding layer 35 each can be made of, for example, n-type InP. The buffer layer 32 works along with the semiconductor substrate 20 to provide a lower cladding region for the core layer 33. The upper cladding layer 35 is disposed on the core layer 33 and the diffraction grating layer 34, which is between the core layer and the upper cladding layer. If needed, the semiconductor laminate 30 may include the buffer layer 32, and the core layer 33 is disposed directly on the principal surface 20a of the semiconductor substrate 20. The core layer 33 extends from the laminate end face 30b in a direction of an axis extending in the Y direction. The core layer 33 includes multiple unit structures. The unit structures are arranged in the direction of an axis along which the core layer and the upper cladding layer are arranged (in the Z direction), thereby forming an array, and the adjoining unit structures in the array are in contact with each other. The array may include, for example, several tens of unit structures. The unit structures each include quantum well layers (several-nanometer thick) and barrier layers (several-nanometer thick), which are alternately arranged to form a superlattice, for example, in the Z direction. The quantum well layers each can include GaInAs or GaInAsP, and the barrier layers each can include AlInAs. Each unit structure is composed of an active layer and an injection layer. The active layers each work as a light emitting region to emit light. The injection layers each can deliver carriers into the adjacent active layer. The active layers and the injection layers are stacked along the Z direction to form a superlattice made of GaInAs/AlInAs.

The mechanism of optical emission of the quantum cascade laser 1 will be briefly described. The quantum cascade laser 1 uses a single kind of carriers, such as electrons, to emit light caused by optical transition of electrons between subbands of the conduction band in the active layers. The quantum cascade laser 1 amplifies the light produced by the emission in the active layers with the lasing cavity thereof, thereby emitting laser light in mid-infrared wavelengths. Specifically, the quantum cascade laser 1 is provided with the following three-level system in the conduction band in the active layer. First, an injection layer injects electrons into the upper level of the active layer by tunneling. These electrons transition from the upper to lower levels of the active layer. This transition creates light having a wavelength of energy equal to its transition energy (the energy difference between the upper and lower levels of the subbands). The electrons in the lower level further makes a non-radiative transition to the bottom level in a short relaxation time by use of LO phonon scattering. As seen from the above description, the energy difference between the lower and bottom levels is designed to allow LO phonons to resonantly scatter the electrons. The non-radiative transition of electrons to the bottom level in a short relaxation time produces an inverted population of electrons between the upper and lower levels in the active layer. The electrons thus relaxed to the bottom level drift to the upper level of the active layer in the next stage by an electric field through the injection layer therebetween. Subsequently, the core layer in the quantum cascade laser 1 repeat the same operations, for example, several tens of times in the core layer to obtain the gain necessary for lasing. The quantum cascade laser 1 provides the quantum well layers and the barrier layers with their thicknesses and their material compositions appropriately selected to allow the adjustment of the energy difference between the upper and lower levels, for example, in the wavelength range of 3 to 20 micrometers for lasing in the infrared region.

As shown in FIG. 3, the diffraction grating layer 34 has a diffraction grating 34a with a periodic surface structure of a period Λ, which has recesses and ridges alternately arranged in the Y direction. The diffraction grating 34a is formed as follows: forming a patterned resist of a period Λ on a film for the diffraction grating layer 34; and etching the film for the diffraction grating layer 34 with the patterned resist to form recesses and ridges, periodically arranged in the Z direction, for the diffraction grating. The diffraction grating of the period Λ can selectively reflect light of a wavelength equivalent to the period Λ, i.e., the Bragg wavelength, and the light thus reflected selectively is amplified by the lasing cavity, leading to lasing in the quantum cascade laser 1 in a single mode at the Bragg wavelength. The performance of the diffraction grating layer 34 is represented by a coupling coefficient indicating the magnitude of coupling between guided light components going forward and backward in the lasing cavity. The diffraction grating 34a with a large coupling coefficient allows the quantum cascade laser 1 to satisfactorily produce a single-mode laser beam. The diffraction grating layer 34 is provided with semiconductor of a high refractive index, such as undoped or n-type GaInAs, to enable a large coupling coefficient.

Note that, if needed, the semiconductor laminate 30 includes the contact layer 36, and otherwise a contact between the upper cladding layer 35 and the upper electrode 50 can provide a good ohmic contact. The contact layer 36 makes good ohmic contact with the upper electrode 50. The contact layer 36 is made of material having a small bandgap and lattice-matched to the semiconductor substrate 20 to enable good ohmic contact. The contact layer 36 is made of, for example, n-type GaInAs.

As shown in FIG. 2, the semiconductor laminate 30 is embedded by the two current blocking portions 40 on both side faces thereof, and the current blocking portions 40 function as a current confinement layer constricting current (carriers) in the semiconductor laminate 30. The two current block portions 40 are disposed on the principal surface 20a of the semiconductor substrate 20 to cover both side faces of the semiconductor laminate 30. Each current block portion 40 includes undoped or semi-insulating semiconductor. These undoped and semi-insulating semiconductors have high electrical resistance, which are suitable for material of the current block portion 40, to carriers, such as electrons. The addition of a transition metal, such as Fe, Ti, Cr, and Co (dopant), to III-V compound semiconductor forms deep levels, which can trap electrons, in the forbidden band to provide host semiconductor with a semi-insulating property. The III-V compound semiconductor doped with the transition metal has a specific resistance of, for example, $10^5$ Ωcm or more to electrons, which is sufficiently high electric resistance. Iron (Fe) is an excellent transition metal to enable the semi-insulating property. An undoped semiconductor with a sufficiently high electric resistance to electrons can be used for the current block portions 40. Undoped or semi-insulating III-V compound semiconductor encompasses InP, GaInAs, AlInAs, GaInAsP, and/or AlGaInAs. These semiconductors are lattice matched to the semiconductor substrate 20, and are grown by a growth method, such as molecular beam epitaxy (MBE) and metalorganic vapor phase epitaxy (OMVPE).

The upper and lower electrodes 50 and 60 are arranged to supply current to the core layer 33. The upper and lower electrodes 50 and 60 each include, for example, Ti/Au, Ti/Pt/Au, or Au/Ge. The upper electrode 50 works as, for example, a cathode electrode, and is disposed on the upper face 30a of the semiconductor laminate 30 (specifically, on the contact layer 36) and the current block portions 40. The lower electrode 60 works as, for example, an anode electrode, and is disposed on the back face 20b of the semiconductor substrate 20 and is in contact with the solder material 4. The lower electrode 60 receives a positive potential with respect to the upper electrode 50.

If needed, an optical confinement layer may be disposed between the core layer 33 and the semiconductor substrate 20 and/or between the core layer 33 and the upper cladding layer 35. The optical confinement layer has a bandgap smaller than the bandgaps of the semiconductor substrate 20 and the upper cladding layer 35, and larger than that of the core layer 33. The optical confinement layer does not block electrons, which are efficiently injected from the buffer layer 32 to the core layer 33 therethrough. This magnitude relationship of these bandgaps allows the optical confinement layer to have a refractive index larger than refractive indices of the semiconductor substrate 20 and the upper cladding layer 35, and smaller than that of the core layer 33. The semiconductor substrate 20 and the upper cladding layer 35, therefore, work to confine light, which is produced by the core layer 33, into the core layer 33 and the optical confinement layer, thereby enhancing the confinement of light into the core layer 33. In order to enhance confinement of light into the core layer 33, the optical confinement layer can be made of material that has a refractive index higher than the refractive indices of the semiconductor substrate 20 and the upper cladding layer 35 and is lattice matched to the semiconductor substrate 20. The optical confinement layer may include, for example, undoped or n-type GaInAs.

The insulating film 71 is disposed adjacent to the rear end face 10a of the semiconductor device portion 10. Specifically, the insulating film 71 has a thick portion on the rear end face 10a, and has upper and has lower thin portions on the upper and lower electrodes 50 and 60, respectively, which adjoin the thick portion. More specifically, the laminate end face 30b and the substrate end face 20c are entirely covered with the thick portion of the insulating film 71, and the upper and lower electrodes 50 and 60 have end portions, which are covered with the upper and lower thin portions of the insulating film 71, close to the rear end face 10a. The thick portion of the insulating film 71 has a thickness, measured in the Y direction, on the rear face 10a larger than thicknesses of the upper and lower portions of the insulating film 71, measured in the Z direction, on the upper and lower electrodes 50 and 60. For example, the thickness of the insulating film 71 on the rear face 10a is in a range of 100 to 200 nm, and the thicknesses of the insulating film 71 measured in the Z direction on the upper and lower electrodes 50 and 60 each are in a range of 20 to 30 nm. The insulating film 71 is made of dielectric material including at least one of $SiO_2$, SiON, SiN, $Al_2O_3$ (alumina), BCB resin, or polyimide resin. The metal film 72, which are on the insulating film 71, is disposed on the laminate end face 30b and the substrate end face 20c and extends from the upper electrode 50 to the lower electrode 60. Specifically, the metal film 72 covers all of the laminate end face 30b and the substrate end face 20c, and covers end portions, close to the rear end face 10a, of the upper and lower electrodes 50 and 60. The metal film 72 may include Au (gold), which enables a reflectivity of 90 percent or more. The solder material 4 is disposed on the submount 3 and reaches the substrate end face 20a. This results in that the metal film 72 on the lower electrode 60 makes contact with the solder material 4. Alternatively, the metal film 72 covers the rear end face 10a without extending on the lower electrode 60, so that the solder material 4, which reaches the substrate end face 20a, makes contact with the bottom portion of the metal film 72. The metal film 72 that does not reach the lower electrode 60 can be formed with a protector 90 which is long enough to reach the rear end face 10a.

The insulating film 75 has a portion between the upper electrode 50 and the metal film 72, which are arranged in the Z direction. Specifically, the insulating film 75 is disposed between the upper electrode 50 and the metal film 72, and is in contact therewith. The insulating film 75 has an end at the upper edge of the rear end face 10a and extends from the upper edge. The insulating film 75 has another end, apart from the rear end face 10a, on the upper electrode 50. The insulating film 71 and the metal film 72 extend along the insulating film 75 in the Y direction, and have respective ends on the insulating film 75, which are apart from and close to the rear end face 10a with respect to the end of the insulating film 75. The end of the metal film 72 is apart from and close to the rear end face 10a as compared to the end of the insulating film 71.

The insulating film 75 has a thickness in the Z direction larger than that of the insulating film 71 on the upper electrode 50. The thickness of the insulating film 75 ranges from 100 to 300 nm, and the range of 150 to 300 nm is better than the above range. The insulating film 75 may be made of a dielectric film, which is the same as the material of the insulating film 71. Alternatively, the insulating film 75 may be made of a dielectric film, which is different from the material of the insulating film 71. The insulating film 75 may be made of a dielectric film, which includes at least one of dielectric film including at least one of $SiO_2$, SiON, SiN, $Al_2O_3$ (alumina), BCB resin, or polyimide resin. The insulating film 75 of $SiO_2$ and SiON can be used to obtain an excellent adhesiveness between the insulating film 75 and the upper electrode 50.

Figure 4A:
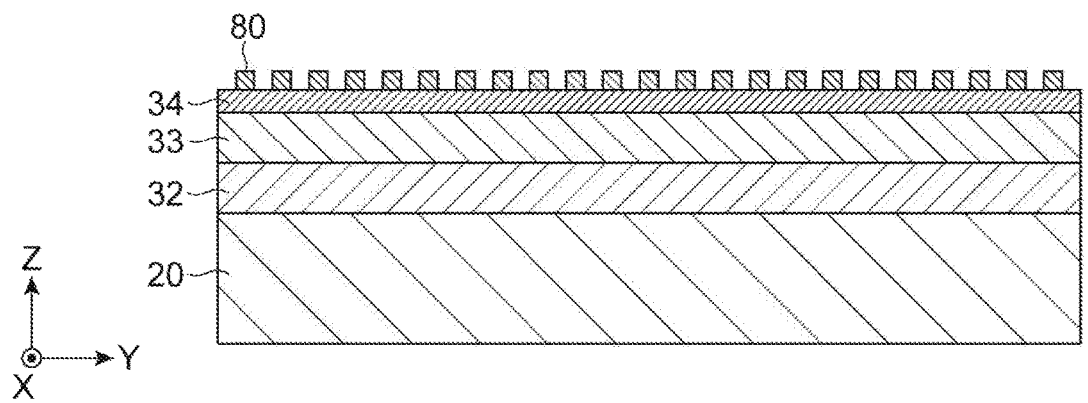
FIG. 4A is a schematic view showing a major process in a method for fabricating a quantum cascade semiconductor laser, shown in FIG. 1, according to the embodiment.
Figure 4B:
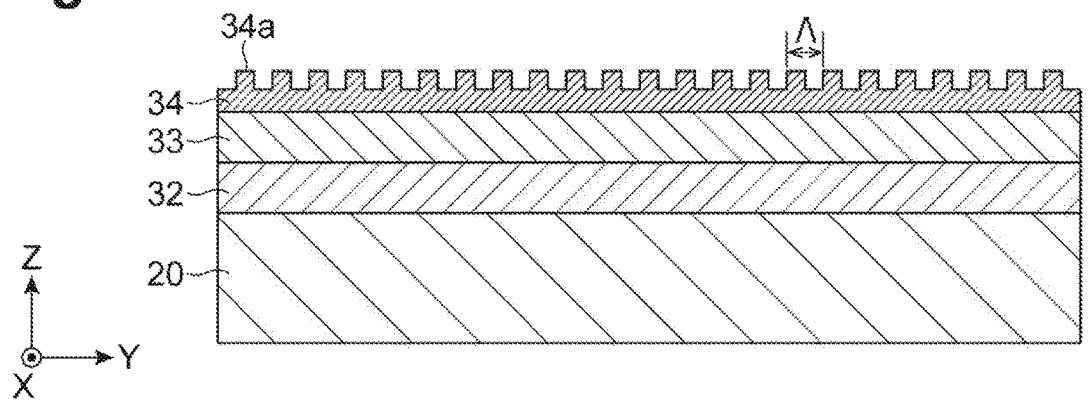
FIG. 4B is a schematic view showing a major process in the method according to the embodiment.

A description will be given of the method for fabricating the quantum cascade laser 1 having the above structure. FIGS. 4A to 4C, FIGS. 5A to 5C, FIGS. 6A to 6C, FIG. 7, FIGS. 8A and 8B, and FIG. 9 are schematic views each showing a major process in a method for fabricating the quantum cascade laser 1 shown in FIG. 1. FIGS. 4A to 4C and FIGS. 6A to 6C are cross sectional views each taken along a line equivalent to line III-III of FIG. 1 and a plane parallel to the YZ plane, and FIGS. 5A to 5C are cross sectional views each taken along a plane parallel to the YZ plane. First, a wafer is prepared which will be the semiconductor substrate 20 in a later process. Then, in a first crystal growth step, the buffer layer 32, the core layer 33, and the diffraction grating layer 34 are grown in order on the principal surface of the wafer by a growth method, such as MBE and OMVPE, to form an epi-wafer. Thereafter, a resist mask 80 is formed on the epi-wafer by photolithography on the diffraction grating layer 34. As shown in FIG. 4A, the resist mask 80 for the diffraction grating 34a has a pattern with a width of A in the Y direction. The epi-wafer is etched with the resist mask 80 in the Z direction to form the diffraction grating 34a with a periodic structure as shown in FIG. 4B in the diffraction grating layer 34.

Figure 4C:
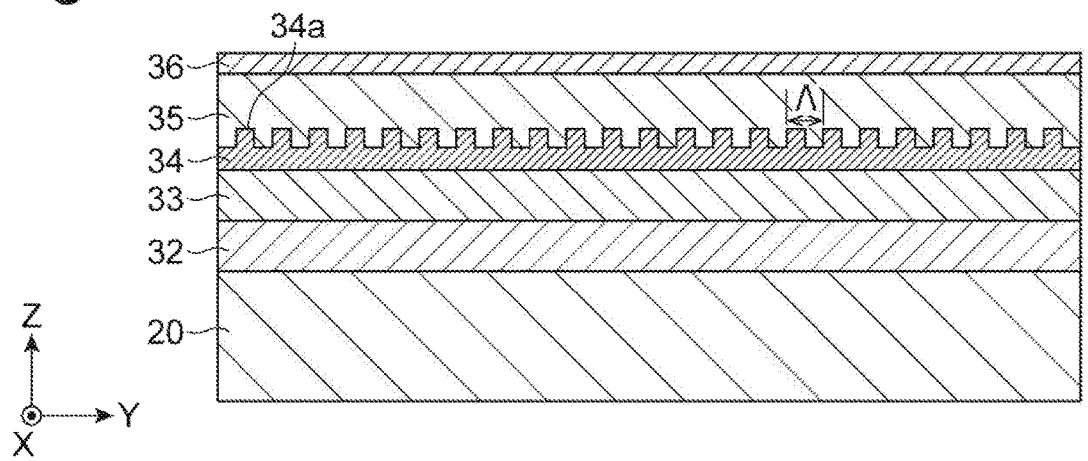
FIG. 4C is a schematic view showing a major process in the method according to the embodiment.
Figure 5A:
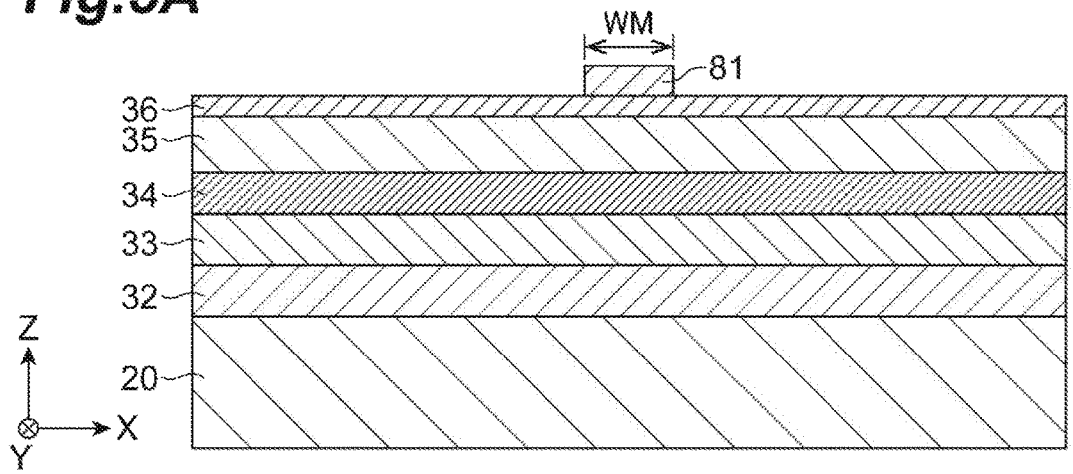
FIG. 5A is a schematic view showing a major process in the method according to the embodiment.
Figure 5B:
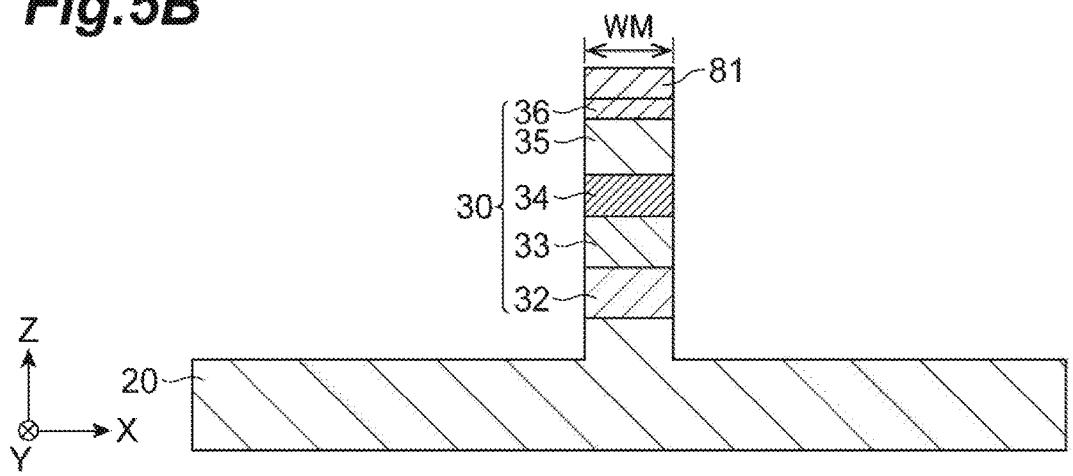
FIG. 5B is a schematic view showing a major process in the method according to the embodiment.
Figure 5C:
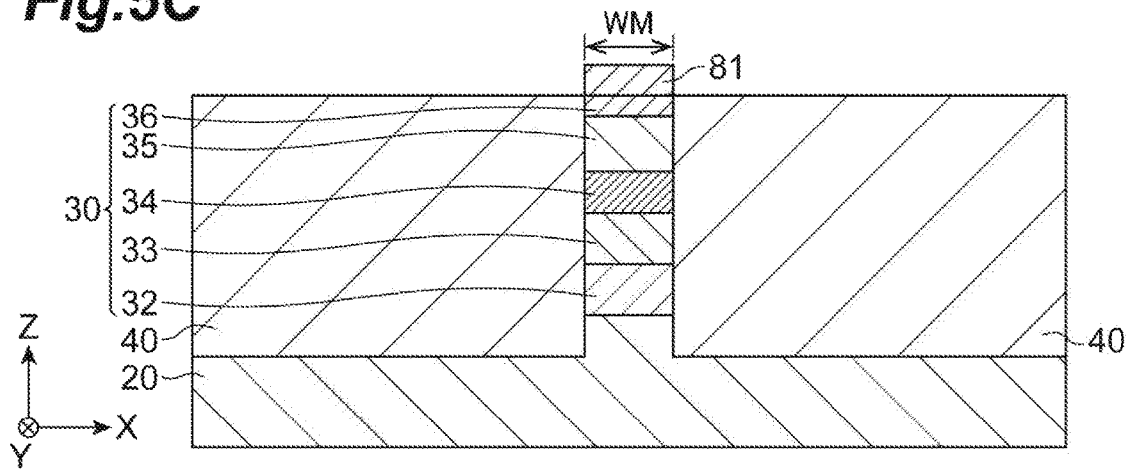
FIG. 5C is a schematic view showing a major process in the method according to the embodiment.

In a second crystal growth step, as shown in FIG. 4C, the upper cladding layer 35 and the contact layer 36 are grown in order on the diffraction grating layer 34. Next, as shown in FIG. 5A, a mask 81 defining the semiconductor laminate 30 is formed on the contact layer 36 by photolithography. The mask 81 has a pattern of a width WM, which is defined in the X direction, extending in the Y direction in each of arrayed device sections for the quantum cascade laser 1, and the pattern is apart from the boundaries between the device sections in the X direction. The mask 81 may include the same material as that of the insulating film 71, and specifically, be mode of a dielectric material containing at least one of SiN, SiON, alumina, and $SiO_2$.

An etching process with the mask 81 forms the semiconductor laminate 30, which has a mesa-shape as shown in FIG. 5B. The etching may include dry etching and/or wet etching, and the dry etching can be used to form the semiconductor laminate 30. The dry etching can provide the semiconductor laminate 30 of the width WM with excellent verticality and high accuracy. The quality of the dry etching greatly affects the device characteristics of the quantum cascade laser 1. The dry etching may be, for example, reactive ion etching (RIE), and the reactive ion etching (RIE) uses plasma of etching gas.

Figure 6A:
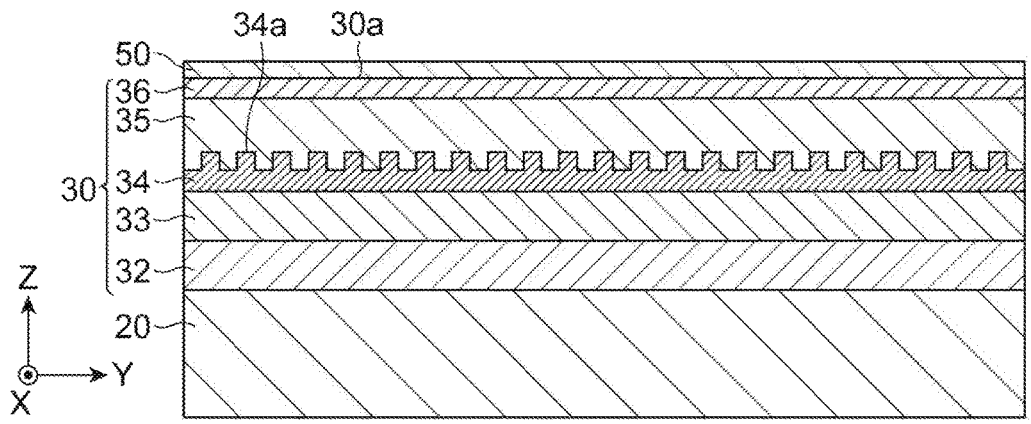
FIG. 6A is a schematic view showing a major process in the method according to the embodiment.
Figure 6B:
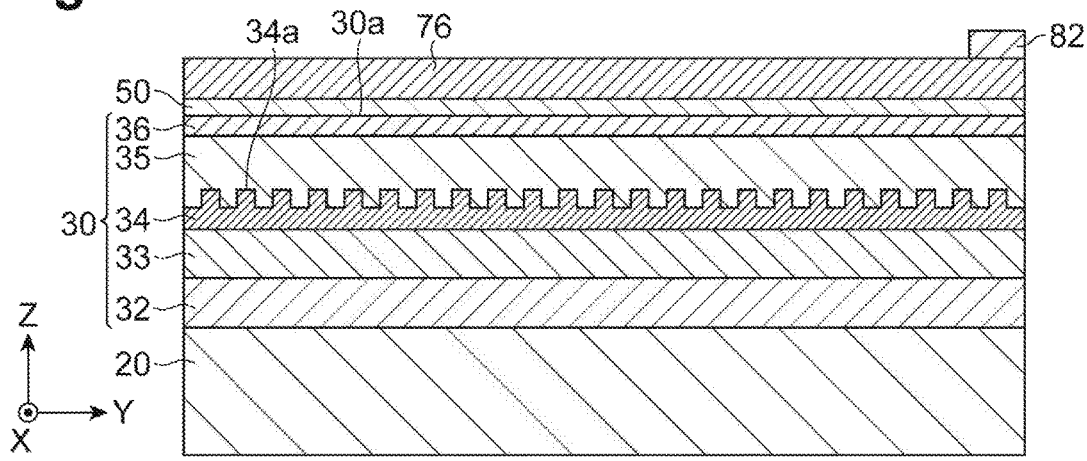
FIG. 6B is a schematic view showing a major process in the method according to the embodiment.
Figure 6C:
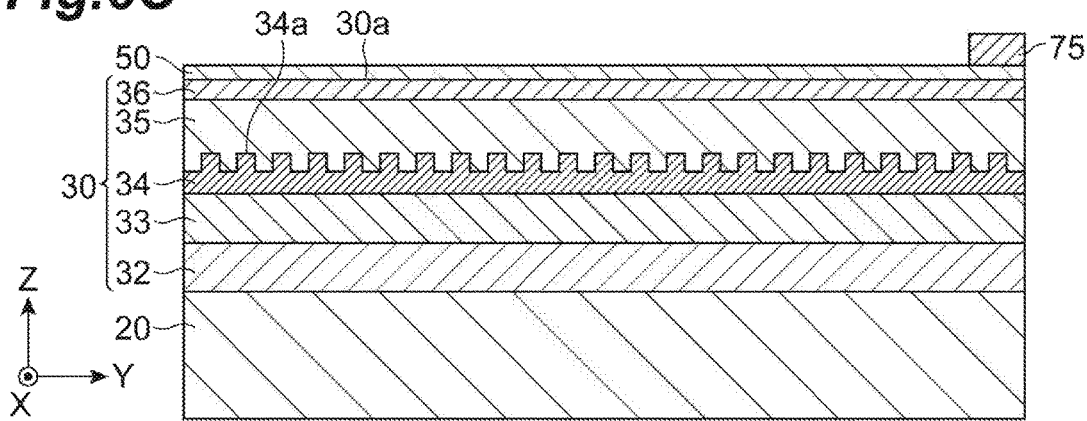
FIG. 6C is a schematic view showing a major process in the method according to the embodiment.

In a third crystal growth step, a semi-insulating semiconductor layer, such as InP doped with Fe, is grown with the mask 81 left on the semiconductor laminate 30. As shown in FIG. 5C, deposited material is hardly formed on the mask 81, and the semi-insulating semiconductor layer is grown on both sides of the semiconductor laminate 30 (grown between adjacent semiconductor laminates 30 formed by the removal in etching in FIG. 5B) so as to embed the semiconductor laminate 30. These two current block portions 40 are formed to embed the semiconductor laminate 30. After removing the mask 81, as shown in FIG. 6A, the upper electrode 50 is formed on the semiconductor laminate 30, specifically, on the upper face 30a. Thereafter, as shown in FIG. 6B, an insulating film 76 for the insulating film 75 is formed on the upper electrode 50. Resist is applied to the insulating film 76, and the applied resist is patterned to form a resist mask 82. Etching the insulating film 76 with the resist mask 82 forms a patterned insulating film 76, i.e., an insulating film 75, on the upper electrode 50. The removal of the resist mask 82 follows the etching. After the removal, the wafer is thinned by polishing to a thickness allowing the cleavage of the wafer (for example, 100 to 200 micrometers), and then as shown in FIG. 7, the lower electrode 60 is formed on the back surface 20b of the thinned semiconductor substrate 20.

Figure 8A:
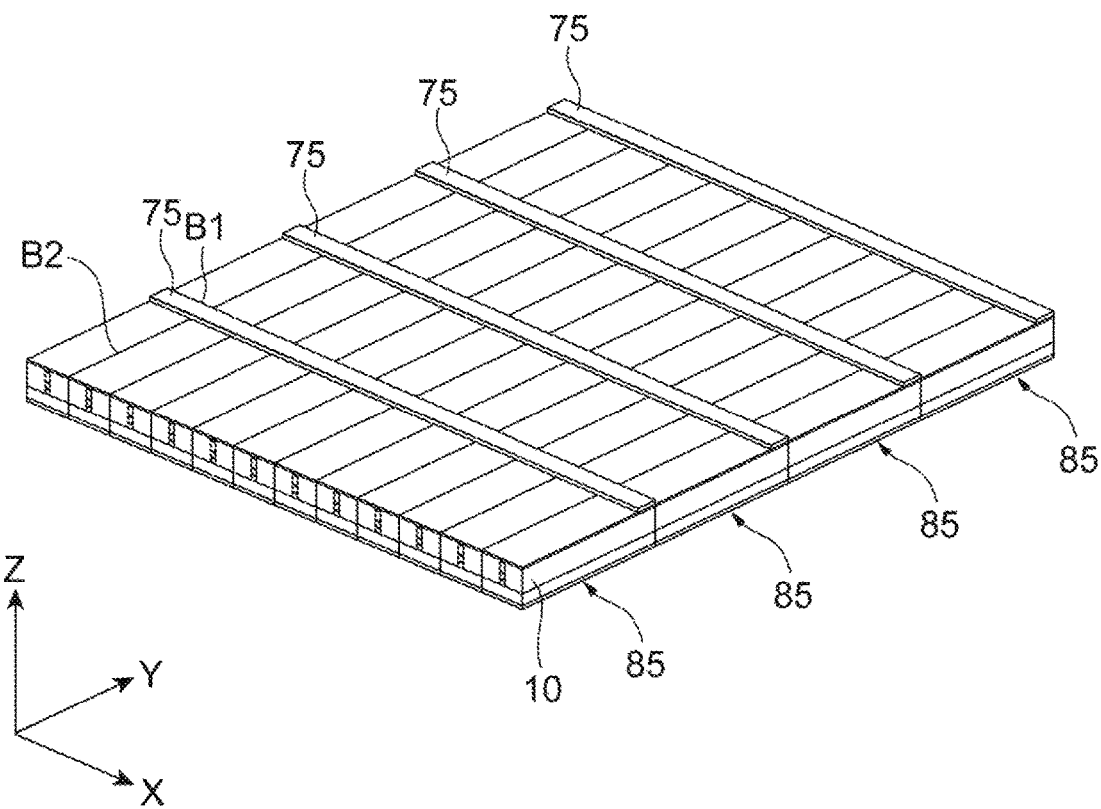
FIG. 8A is a schematic view showing a major process in the method according to the embodiment.
Figure 8B:
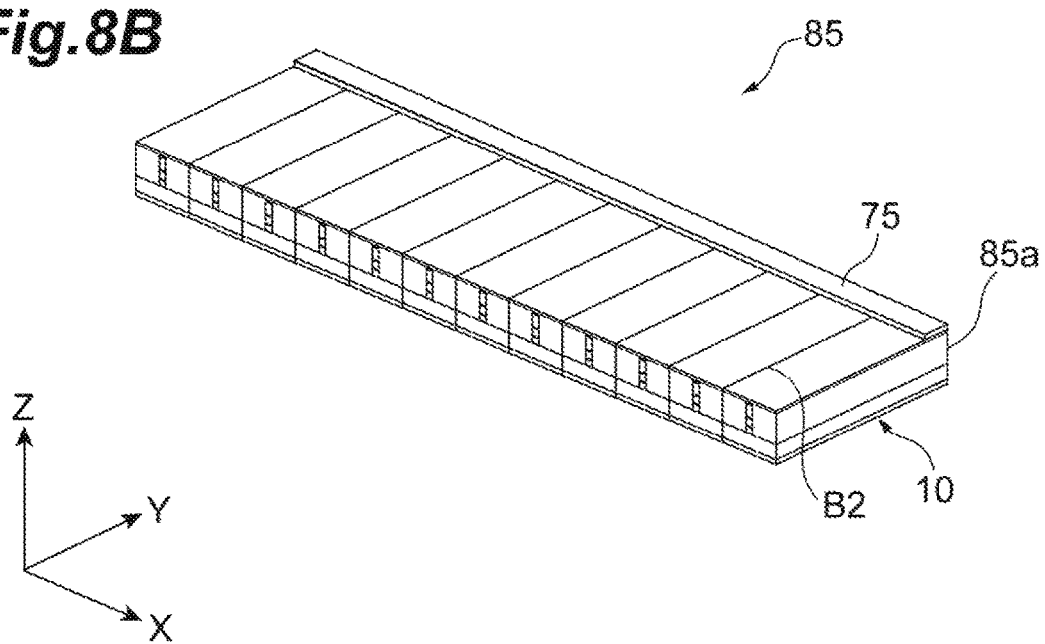
FIG. 8B is a schematic view showing a major process in the method according to the embodiment.

The above processes bring a wafer product to completion. FIG. 8A shows a wafer product including device sections for the semiconductor device portions 10, which are arranged in the X and Y directions over the entire wafer, for the multiple quantum cascade lasers 1 and the insulating film 75 formed on the device sections. In FIG. 8A, boundary lines B1 and B2 defining the device sections are depicted and the wafer product are, finally, divided along the lines B1 and B2 to form the multiple semiconductor device portions 10. Specifically, the boundary lines B1 extend in the X direction and the boundary lines B2 extend in the Y direction. First, the wafer product is separated by cleavage at the boundary lines B1 into chip-bars each having the arrangement of multiple semiconductor device portions 10, e.g. a chip-bar 85 as shown in FIG. 8B. The chip-bar 85 includes multiple device sections for the semiconductor device portions 10, arranged along the X direction, and the insulating films 75 formed thereon. The chip-bar 85 has an end face 85a including the rear end faces 10a of the quantum cascade lasers 1 arranged in the X direction. The insulating film 75 extends in the X direction along the end face 85a.

Figure 9:
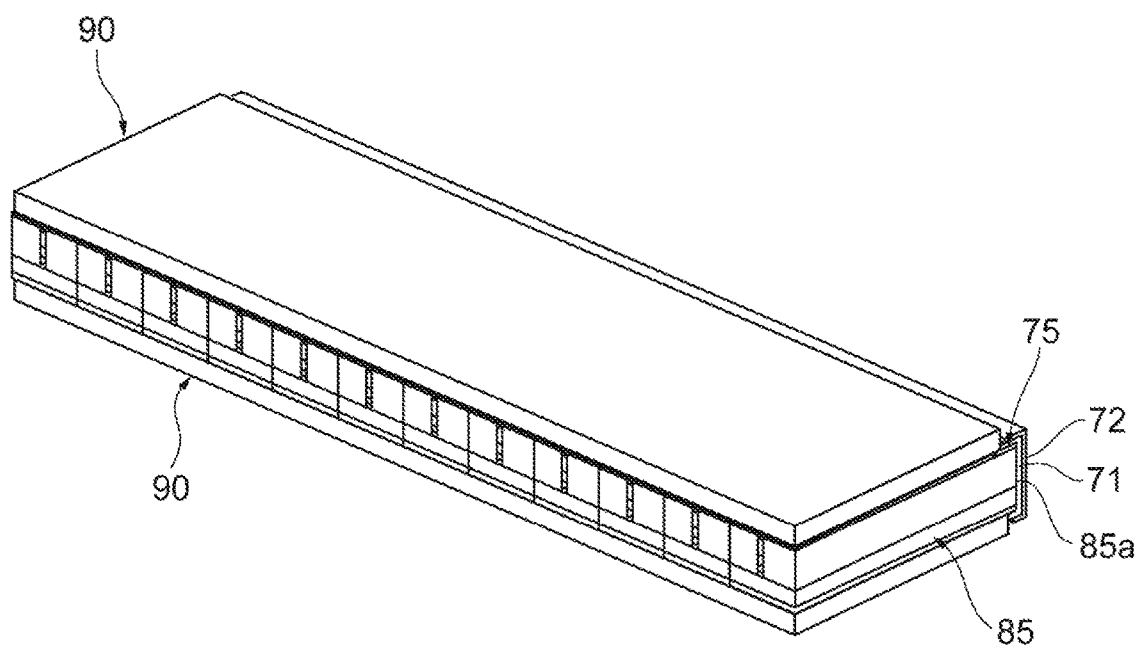
FIG. 9 is a schematic view showing a major process in the method according to the embodiment.

A description will be given of a process of forming the insulating film 71 and the metal film 72 on the end face 85a. First, as shown in FIG. 9, two protectors 90 are prepared in order to form the insulating film 71 on a desired area of the chip bar 85, and the desired area includes the end face 85a of the chip bar 85. The protectors 90 each may have a thin plate of a rectangle, the longitudinal of which is oriented to the X direction as shown in FIG. 9. One protector 90 is attached thereto to cover, except for the near zone of the upper electrode 50 close to the end face 85a of the chip bar 85, almost all the upper electrode 50, i.e., the far zone of the upper electrode 50, and not to cover the end face 85a, and the near and far zones are arranged in the Y direction. The one protector 90 has an end at the boundary between the near and far zones of the upper electrode 50. Another protector 90 is attached thereto to cover, except for the near zone of the lower electrode 50 close to the end face 85a of the chip bar 85, almost all the lower electrode 60, i.e., the far zone of the lower electrode 50, and not to cover the end face 85a, and the near and far zones are arranged in the Y direction. The other protector 90 has an end at the boundary between the near and far zones of the lower electrode 60. After attaching these protectors 90 to the chip-bar, an insulating film 71 is formed on the end face 85a. Specifically, flux containing constituent atoms for the insulating film 71 is supplied to the end face 85a, and the constituent atoms are deposited on the end face 85a, for example, by CVD or sputtering to form the film. The constituent atoms fly toward the end face 85a in the normal direction of the end face 85a. At this time, the constituent atoms that miss the end face 85a fly along both the upper and lower electrodes 50 and 60 and the insulating film 75, and are deposited on a part of the insulating film 75 and parts of the upper and lower electrodes 50 and 60 included in the near zone of the chip bar 85, thereby forming the insulation film 71. The insulating film 71 is formed on the end face 85a and the near zones of the chip bar 85 to form a second wafer product. After forming the insulation film 71, the protectors 90 are detached from the chip-bar.

A description will be given of a process of forming the metal film 72 on the end face 85a. Specifically, electron beam evaporation is used to deposit constituent atoms for the metal film 72 on the end face 85a. This evaporation can form the metal film 72, which covers the insulating film 75 in the near zones of the chip bar 85, on the insulating film 71. The metal film 72 is formed on the end face 85a and the insulating film 75 on the near zone of the chip bar 85.

The protector 90 for forming the metal film 72 has a length in the Y direction longer than that of the protector 90 for forming the insulating film 71 in the Y direction. The end of the metal film 72 is positioned closer to that of the insulating film 71 on the upper electrode 50 and the insulating film 75 with respect to the end face 85a in the Y direction, so that the difference in position between these ends can prevent the metal film 72 from being in direct contact with the upper electrode 50 to form a short circuit path. After forming both the insulating film 71 and the metal film 72, the chip bar 85 thus formed is broken along the boundary lines B2 by cleavage (referring to FIG. 8B) into the quantum cascade lasers 1 as shown in FIG. 1. After forming the metal film 72, the protectors 90 are detached from the chip-bar.

A description will be given of advantageous effects of the quantum cascade laser 1 according to the above-described embodiment. A quantum cascade laser is a promising light source that can be used in technical fields, such as environmental gas analysis, medical diagnosis, and industrial processing. The quantum cascade laser produces a lasing light beam in mid-infrared wavelengths (for example, a wavelength range of 3 to 30 micrometers). Quantum cascade lasers can be light sources that offer a reduction in size and cost, and are now being developed. Particularly, in the field of gas sensing, which is promising in the mid-infrared wavelengths, the development of single-mode DFB quantum cascade lasers in the mid-infrared region become the mainstream because they can provide light for use in detecting an absorption line of a specific gas. Such a quantum cascade laser has, in principle, the occurrence of non-radiative recombination due to LO phonon scattering, which increase the threshold current for lasing of several hundred of mA to several amperes, so that the quantum cascade laser consumes a large amount of power. The increase in the threshold current is one of the reasons to hinder the practical application of the quantum cascade laser. In order to suppress the increase in the threshold current, the quantum cascade laser can be provided with the lasing cavity including a metal film on the end face thereof.

Figure 10:
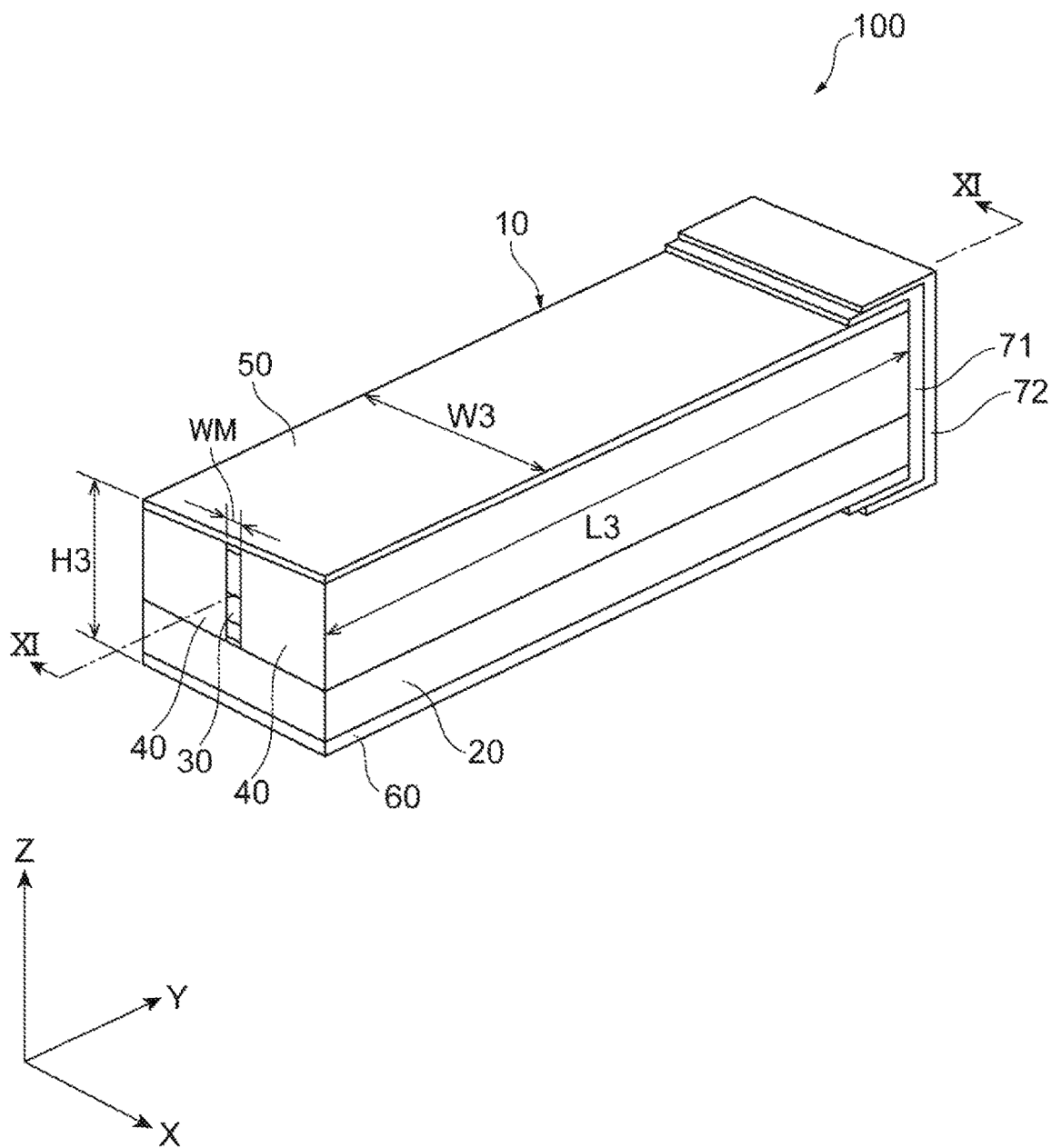
FIG. 10 is a perspective view showing another quantum cascade semiconductor laser.
Figure 11:
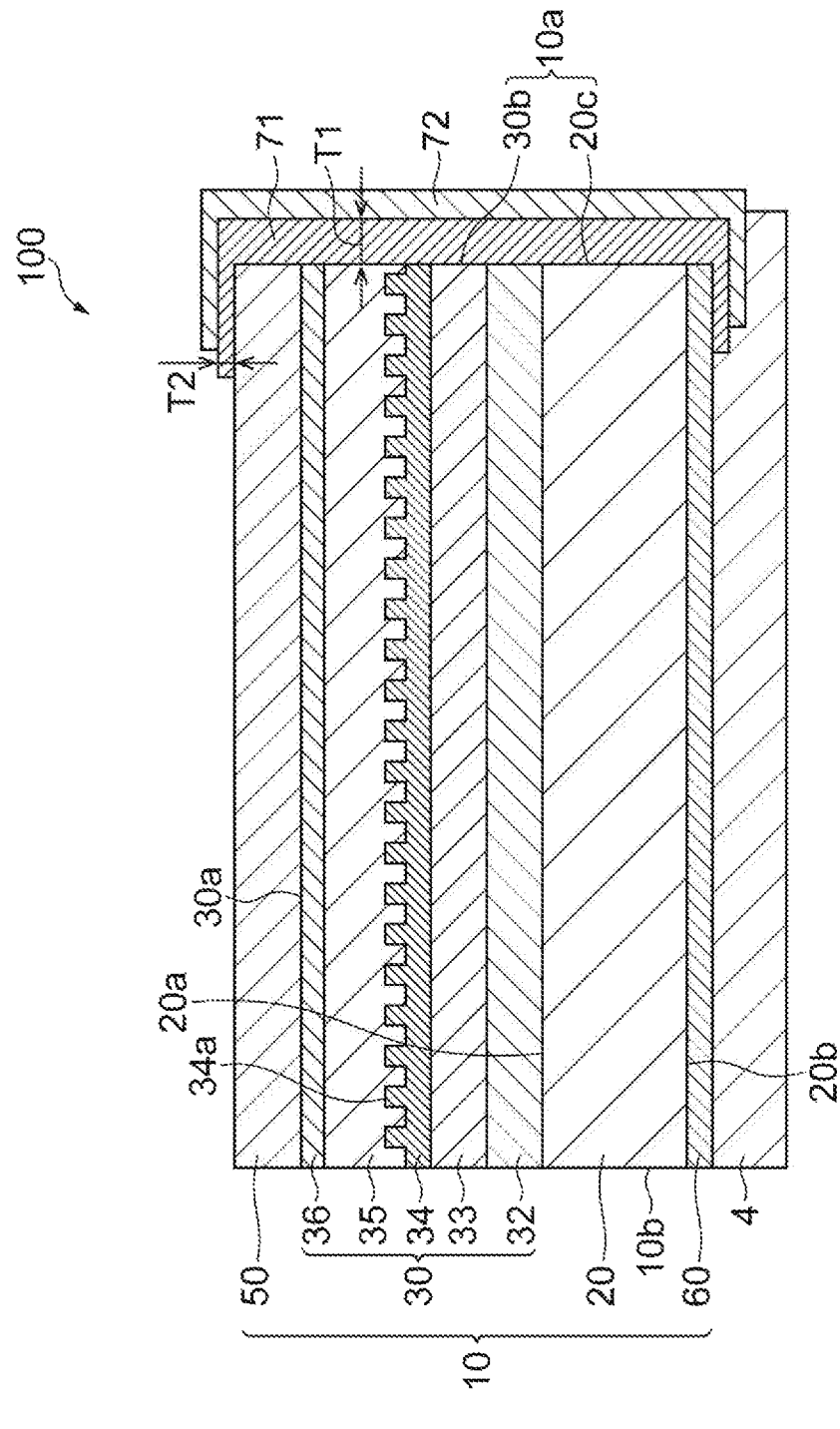
FIG. 11 is a cross-sectional view taken along line XI-XI shown in FIG. 10.

A description will be given of the structure of a quantum cascade laser having a metal film on the end face thereof. FIG. 10 is a perspective view showing the quantum cascade laser 100. FIG. 11 is a cross-sectional view taken along line XI-XI shown in FIG. 10. For easy understanding, an XYZ coordinate system is depicted in each figure, and in the present embodiment, X-, Y-, and Z-directions are orthogonal to each other. Please note that, in order to show a conductive path through the solder material, FIG. 11 shows not only the quantum cascade laser 100 but also the solder material 4, which is used in mounting the quantum cascade laser 100 on a submount. The quantum cascade laser 100 has a buried-heterostructure similar to that of the quantum cascade laser 1 of the present embodiment. As shown in FIG. 10, the quantum cascade laser 100 includes a semiconductor device portion 10, an insulating film 71, and a metal film 72.

The quantum cascade laser 100 is different from the quantum cascade laser 1 according to the present embodiment in that the quantum cascade laser 100 does not have any the insulating film 75. Mounting the quantum cascade laser 100 on the submount with the solder material 4 causes the metal film 72 on the lower electrode 60 to make contact with the solder material 4. The application of an external voltage (for example, a high voltage of 10 volts or more) between the upper and lower electrodes 50 and 60 enabling laser oscillation in the quantum cascade laser 100 results in the application of the voltage thus applied to the metal film 72 via the solder material 4. The external voltage, consequently, is applied to the insulating film 71 between the upper electrode 50 and the metal film 72 on the upper electrode 50.

As described above, the thickness T2 of the insulating film 71 on the upper electrode 50, however, is extremely thinner than the thickness T1 of the insulating film 71 on the rear end face 10a. The above high voltage of, for example, 10 volt or more may be applied to the insulating film 71, disposed between the metal film 101 and the metal film 72 on the upper electrode 50, to cause breakdown of the insulating film 71. This breakdown may form a current path in the insulating film 71, and the current path allows a large amount of current (i.e., inrush current) to flow in the vicinity of the rear end face 10a, so that the quantum cascade laser 100 may be subject to failure, such as breakage in the vicinity of the end face. Making an insulating film on the upper electrode 50 thick provides the resultant insulating film on the rear end face 10a with a large thickness (for example, several times thicker than before). Forming this thick film increases deposition time to form the insulating film 71 on the rear face 10a (for example, several times longer), thereby reducing the productivity of the quantum cascade laser 100. An insulating film with such a large thickness may apply a large stress to the rear end face 10a, and such a stress may cause deterioration of the rear end face 10a, such as cracking of the insulating film 71, and peeling-off from the rear end face 10a.

In contrast, as shown in FIG. 3, the quantum cascade laser 1 according to the present embodiment is provided with the insulating film 75, which has a thickness larger than that of the insulating film 71, between the upper electrode 50 and the metal film 72, so that the insulating films 71 and 75, which form an integral insulating region on the upper electrode 10, are disposed between the upper electrode 50 and the metal film 72 to make the insulating region thick. This insulating region can provide the quantum cascade laser 1 with a high dielectric strength. The quantum cascade laser 1 can lessen the occurrence of breakdown of the insulating region (including the insulating films 71 and 75) in receiving the above voltage, thereby preventing the deterioration due to the dielectric breakdown of the insulating films 71 and 75 in the device performance of the quantum cascade laser 1.

In addition, as in the present embodiment, the insulating film 71 may include at least one of $SiO_2$, SiON, SiN, alumina, BCB resin, and polyimide resin. The insulating film 75 may include at least one of $SiO_2$, SiON, SiN, alumina, BCB resin, and polyimide resin. These materials have excellent durability and insulating properties for use in a protective film for the rear end face 10a. Further, these dielectric films are provided by a familiar method, such as sputtering, CVD, and spin coating, which can easily form the films on the rear end face 10a. Using one of these methods makes introduction of the deposition of the insulating film 71 into the fabricating process of the quantum cascade laser 1 easy.

In the present embodiment, the metal film 72 may include gold (Au). Gold can provide the metal film 72 on the rear end face 10a with a high reflectivity of, for example, more than 90 percent.

In the present embodiment, the upper cladding layer 35 may include an InP layer. InP is transparent (no absorption of light) to lasing light in the mid-infrared wavelengths, and can be suitable as material of the upper cladding layer 35. InP is a binary mixed crystal, which is lattice-matched to the semiconductor substrate 20 of InP, so that an InP layer can be satisfactorily grown on the InP substrate. Further, InP has an excellent thermal conductivity, and can dissipate heat from the core layer 33 through the upper cladding layer 35 satisfactorily. This excellent thermal conductivity can provide the quantum cascade laser 1 with excellent temperature characteristics.

In the present embodiment, the core layer 33 includes multiple active layers enabling light emission, and multiple injection layers enabling injection of carriers into the adjacent active layer, and the active layers and the injection layers are arranged in the Z direction. Providing the injection layer between adjacent active layers as above allows electrons thus optically-transitioned in the upstream active layer to continuously and smoothly move to the downstream active layer, and this delivering of electrons can generate light emission between the subbands in the conduction band in the active layer. The core layer 33 can provide the quantum cascade laser 1 with excellent lasing characteristics.

In the present embodiment, the active layers and the injection layers each may include an array of GaInAs/AlInAs superlattices. Each superlattice can provide transitions between subbands of electron in the conduction band in the active layer, and the subband transition allows optical emission of mid-infrared wavelengths (e.g., 3 to 20 micrometers). The quantum cascade laser 1 provides the core layer 33 with material allowing lasing of a wavelength in the mid-infrared wavelengths.

In the present embodiment, the semiconductor substrate 20 may be an InP base. The semiconductor laminate 30 of the quantum cascade laser 1 has a lattice constant close to that of InP. Using the InP base for the semiconductor substrate 20 allows the growth of the semiconductor laminate 30 on the semiconductor substrate 20 with an excellent crystal quality. InP is transparent to light in the mid-infrared wavelengths, so that the InP substrate can work as a lower cladding region for the core layer 33.

(First Modification)

Figure 12:
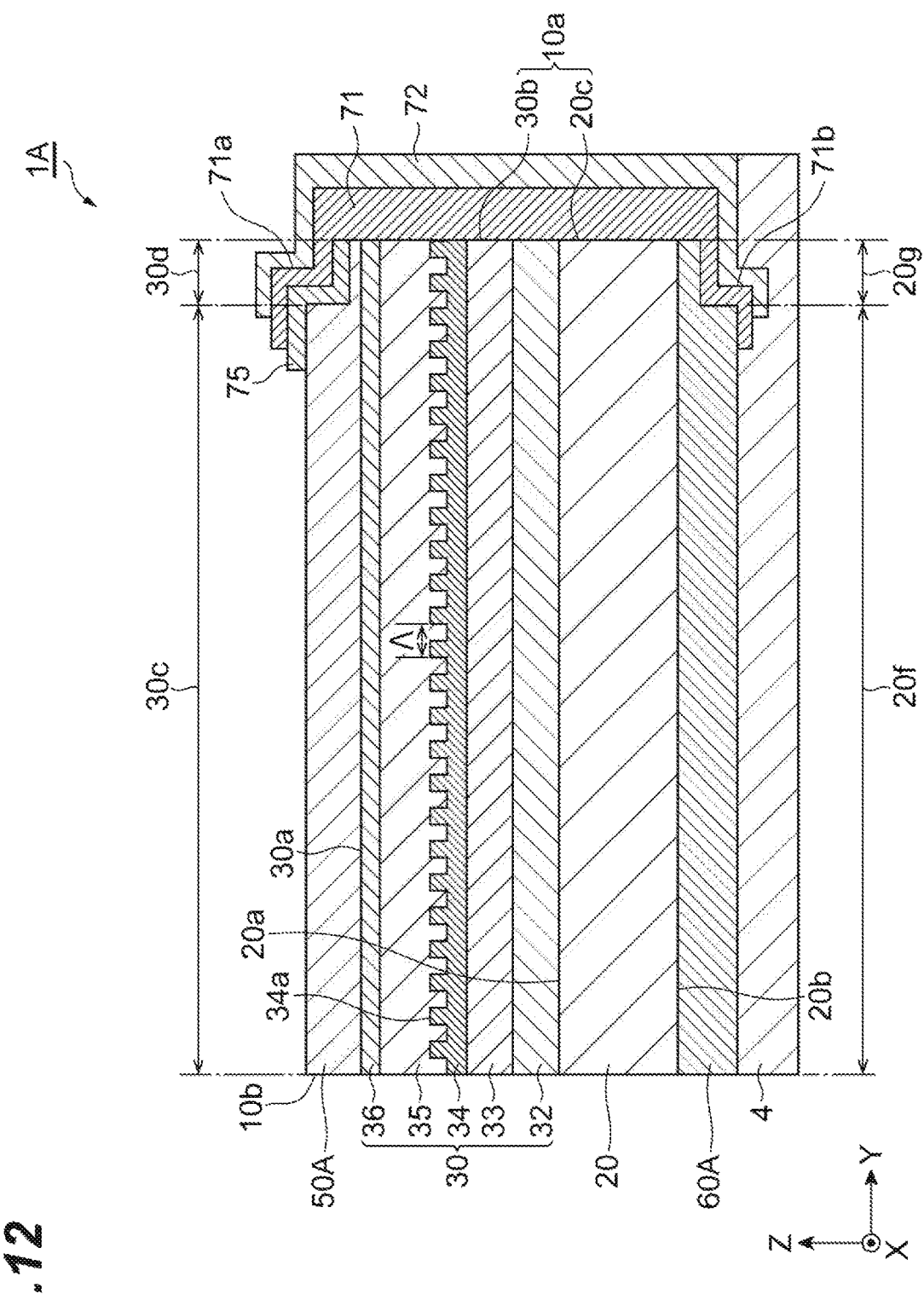
FIG. 12 is a perspective view showing a quantum cascade semiconductor laser according to another embodiment.

FIG. 12 is a perspective view showing the quantum cascade laser 1A according to the first modification of the embodiment. FIG. 12 is a cross-sectional view, taken along a plane parallel to the YZ-plane in the present embodiment, showing the semiconductor laminate 30. The quantum cascade laser 1A is different from the quantum cascade laser according to the above embodiment in thicknesses of the upper and lower electrodes 50 and 60. Specifically, the upper and lower electrodes 50 and 60 of the quantum cascade laser 1A each include a portion having a thickness smaller than the remaining portion. With reference to FIG. 12, the semiconductor laminate 30 provides the upper surface 30a with a first upper area 30c and a second upper area 30d, which is disposed between the first upper area 30c and the laminate end face 30b in the Y direction, and the first and second upper areas 30c and 30d are arranged in the direction from the front end face 10b to the rear end face 10a, e.g., in the Y direction. In the present embodiment, the upper surface 30a has the second upper area 30d and the remaining area, i.e., the first upper area 30c, and the second upper area 30d is contiguous to the rear end face 10a and apart from the front end face 10b in one end portion of the upper face 30a. The upper electrode 50A is disposed on the first and second upper areas 30c and 30d. The upper electrode 50A has a first upper electrode portion on the first upper area 30c and a second upper electrode portion on the second upper area 30d, and the second upper electrode portion has a thickness smaller than that of the first upper electrode portion.

The semiconductor substrate 20 provides the back surface 20b with a first back area 20f and a second back area 20g, which is disposed between the first back area 20f and the substrate end face 20c in the Y direction, and the first and second back areas 20f and 20g are arranged in the direction of the front end face 10b to the rear end face 10a, e.g., the Y direction. In the present embodiment, the back surface 20b has the second back area 20g and the remaining area, i.e., the first back area 20f, and the second back area 20g is contiguous to the front end face 10a and apart from the front end face 10b in one end portion of the lower surface 20b. The lower electrode 60A is disposed on the first and second back areas 20f and 20g. The lower electrode 60A has a first lower electrode portion on the first back area 20f and a second lower electrode portion on the second back area 20g, and the second lower electrode portion has a thickness smaller than that of the first lower electrode portion.

In order to avoid deterioration of heat dissipation in the quantum cascade laser 1A, the upper and lower electrodes 50A and 60A have respective thicknesses, each of which is in the range of 5 to 10 micrometers, on the first upper area 30c and the first back area 20f in the Z direction. In contrast, the upper and lower electrodes 50A and 60A have respective thicknesses, each of which is in the range of 0.5 to 1.0 micrometers, on the second upper area 30d and the second back area 20g in the Z direction. The upper and lower electrodes 50A and 60A have respective lengths (which may be the same lengths as the second upper area 30d and the second back area 20g), each of which is in the range of 10 to 100 micrometers, on the second upper area 30d and the second back area 20g in the Y direction.

The insulating films 71, 75 and 72 are disposed on the first and second upper areas 30c and 30d. Further, the insulating films 71 and 72 are disposed on the first and second back areas 20f and 20g. The insulating film 71 is conformal with the top of the upper electrode 50A, and has a stepped portion 71b (a difference in level) at the boundary between the first and second electrode portions, which are disposed on the first and second upper areas 30c and 30d, respectively. The insulating film 71 is conformal with the top of the lower electrode 60A, and has a stepped portion 71c (a difference in level) at the boundary between the first and second electrode portions of the lower electrode 60A, which are disposed on the areas 20g and 20f, respectively. In one example, the stepped portions 71b and 71c each extend in the direction orthogonal to the Y direction.

Metal films for the upper and lower electrodes 50A and 60A have respective thinned portions around cleavage lines, and this thinning makes it easy to conduct cleavage in forming chip bars, each of which has the partly-thinned upper and lower electrodes 50A and 60A in the vicinity of the rear end face 10a (specifically, the laminate end face 30b and the substrate end face 20c), allowing yield enhancement in the method for fabricating the quantum cascade laser 1A. In the upper electrode 50A, the thickness of the second electrode portion, which is on the second upper area 30d, is smaller than that of the first electrode portion, which is on the first upper area 30c, so that the second electrode portion has a sheet electrical resistance larger than that of the first electrode portion. In the lower electrode 60A, the thickness of the second electrode portion, which is on the second area 20g, is smaller than that of the first electrode portion, which is on the first area 20f, so that the second electrode portion has a sheet electrical resistance larger than that of the first electrode portion. These large-resistance portions of the upper and lower electrodes 50A and 60A make it possible to reduce a leakage current flowing in the vicinity of the rear end face 10a. The reduced leakage current can provide the quantum cascade laser 1A with improved device performances (for example, the threshold current can be reduced). The quantum cascade laser 1A, which has thin portions of the upper and lower electrodes 50A and 60A on the second areas 30d and 20g, also has the same advantageous effects as that of the above embodiment.

Figure 13A:
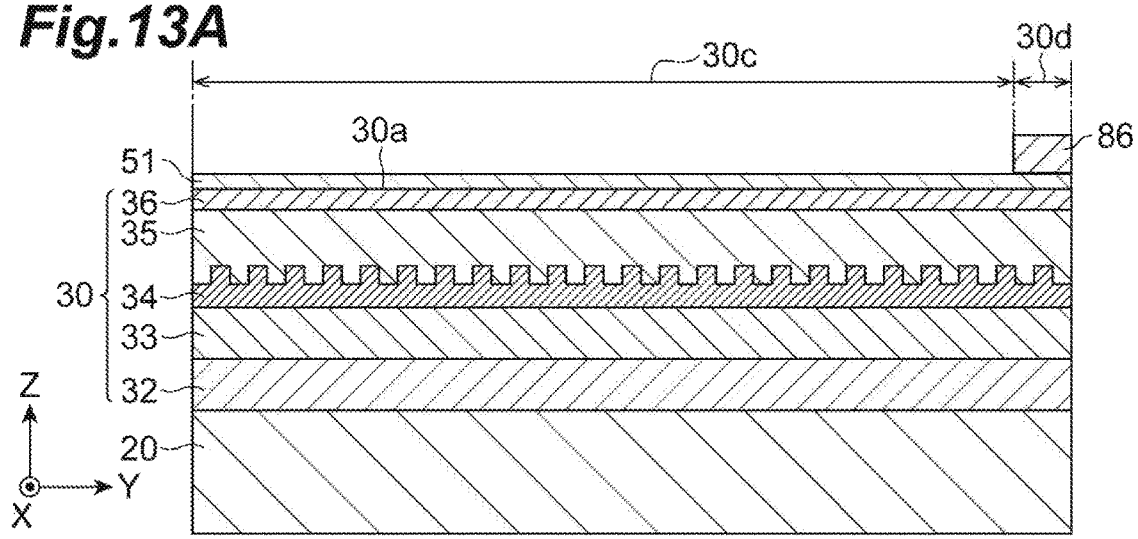
FIG. 13A is a schematic view showing a major process in the method according to still another embodiment.
Figure 13B:
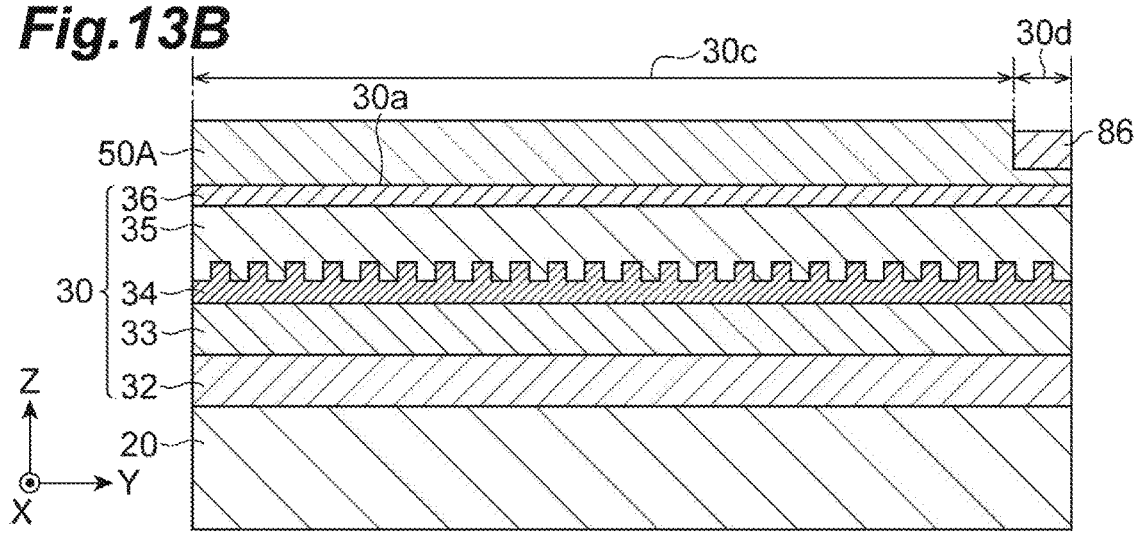
FIG. 13B is a schematic view showing a major process in the method according to still another embodiment.
Figure 13C:
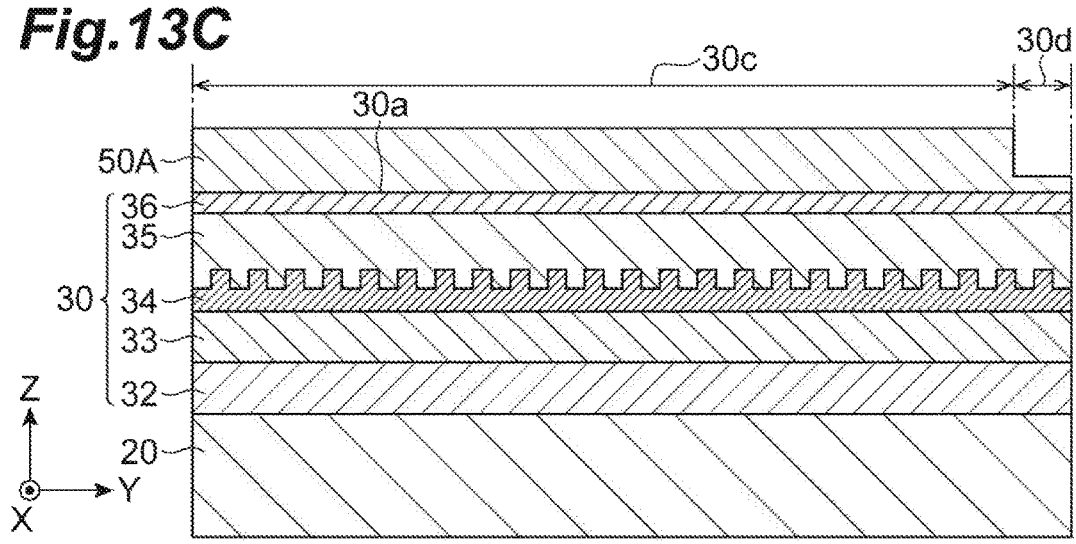
FIG. 13C is a schematic view showing a major process in the method according to still another embodiment.

Subsequently, a description will be given of a method for fabricating the quantum cascade laser 1A according to the present modification. The method for fabricating the quantum cascade laser 1A according to this modification has a former part, which has the same process steps as those in the first embodiment method and ends at the third crystal growth step (as shown in FIG. 5C) of forming the two current block portions 40, and a latter part, which begins with the process of forming the upper electrode 50A on the semiconductor laminate 30. In the following description, the latter part will be described in detail. FIGS. 13A to 13C are views each showing a process of fabricating the quantum cascade laser 1A shown in FIG. 12. FIGS. 13A to 13C are cross sectional views, each taken along a plane equivalent to the YZ plane, showing the semiconductor laminate 30 of the quantum cascade laser 1A. As shown in FIG. 13A, a thin metal film 51 for the upper electrode 50 A is formed on the entire upper face 30a of the semiconductor laminate layer 30. Thereafter, resist is applied to the metal film 51, and then is pattered to form a resist mask 86, which has a pattern covering the second area 30d.

As shown in FIG. 13B, a metal film 51 is further formed on the thin metal film 51 with the resist mask 86. In this deposition, the metal film 51 is not formed on the resist mask 86, and deposited on the metal film 51 on the first area 30c in the opening of the resist mask. The resulting metal film 51 on the second area 30d has a thickness smaller than that of the metal film 51 on the first area 30c. As shown in FIG. 13C, the resist mask 86 is removed to form the upper electrode 50A on the upper face 30a. Thereafter, the insulating film 75 is deposited on the upper electrode 50A in the same manner as the above description of the embodiment (with reference to FIGS. 6B and 6C). Subsequently, the lower electrode 60A is formed on the back surface 20b of the semiconductor substrate 20 in the same manner as that of forming the upper electrode 50A. The subsequent steps are the same as those in the above embodiment.

Specifically, flux of metal particles for the metal film 72 is supplied toward the end face 85a to form the metal film 72, and a part of the flux is bounced back by the stepped portion 71a, which hinders the flux from flying along the upper electrode 50A. This stepped portion makes it difficult for the metal film 72 to be deposited on a part of the upper electrode 50A on the first upper area 30c, ensuring electrical insulation between the metal film 72 and the upper electrode 50A. The stepped portion 71b also bounces back a part of the flux for the metal film 72 to hinder the flux from flying along the lower electrode 60A. This stepped portion makes it difficult for the metal film 72 to be deposited on a part of the lower electrode 60A on the first back area 20f, ensuring electrical insulation between the metal film 72 and the lower electrode 60A. The quantum cascade laser 1A according to the present modification can enhance the insulation in the vicinity of the rear end face 10a, and reduce the occurrence of breakdown of the insulating film 71 in the vicinity of the rear end face 10a. This modification shows that both the upper electrode 50A on the second upper area 30d and the lower electrode 60A on the second back area 20g can be partly thinned and that alternatively, one of the upper and lower electrodes 50A and 60A may be partly thinned. Specifically, the upper electrode 50A may be partly thinned on the second upper area 30d and/or the lower electrode 60A may be partly thinned on the second back area 20g. These three kinds of the quantum cascade lasers 1A each have the same advantageous effects as those of the embodiment.

Figure 14:
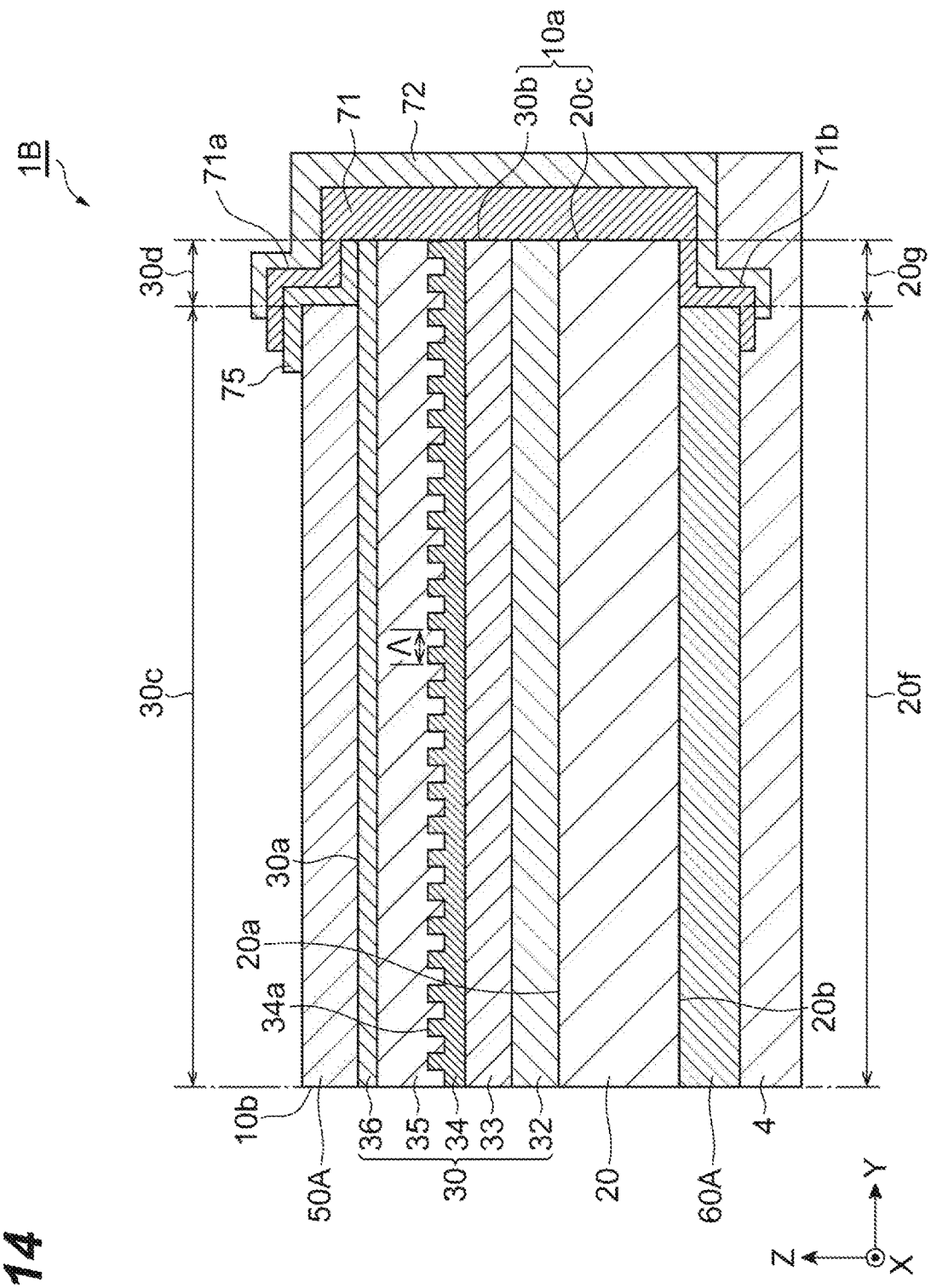
FIG. 14 is a cross-sectional view showing the quantum cascade semiconductor laser according to still another embodiment.

FIG. 14 is a cross-sectional view showing a quantum cascade laser 1B according to the present modification. As shown in FIG. 14, the upper electrode 50A is disposed on the first upper area 30c and is not disposed on the second upper area 30d, and the lower electrode 60A may be disposed on the first back area 20f and is not disposed on the second back area 20g. The insulating films 71, 75 and 72 extend from the second back area 20g to the first back area 20f. The insulating films 71, 75 and 72 extend from the second upper area 30d to the first upper area 20g. The partial removal of the upper and lower electrodes 50A and 60A in the vicinity of the rear end face 10a allows the quantum cascade laser 1B to have the above-described advantageous effects. Specifically, distancing the metal films for the upper and lower electrodes 50A and 60A apart from lines to be cleaved makes it easy to form the rear face 10a by cleavage, and provides increase in yield in fabricating the quantum cascade laser 1B. Spacing the upper and lower electrodes 50A and 60A apart from the rear end face 10a makes the electric resistance in the vicinity of the rear end face 10a large, thereby reducing the leakage current flowing in the vicinity of the rear end face 10a. The quantum cascade laser 1B is provided with improved device characteristics (in particular, the reduction in the threshold current).

Figure 15A:
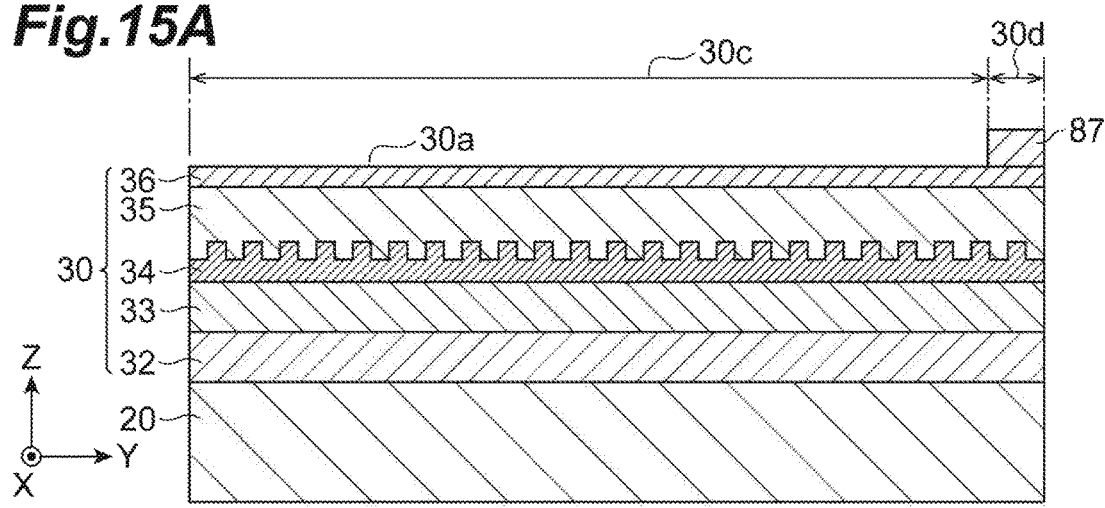
FIG. 15A is a schematic view showing a major process in the method according to still another embodiment.
Figure 15B:
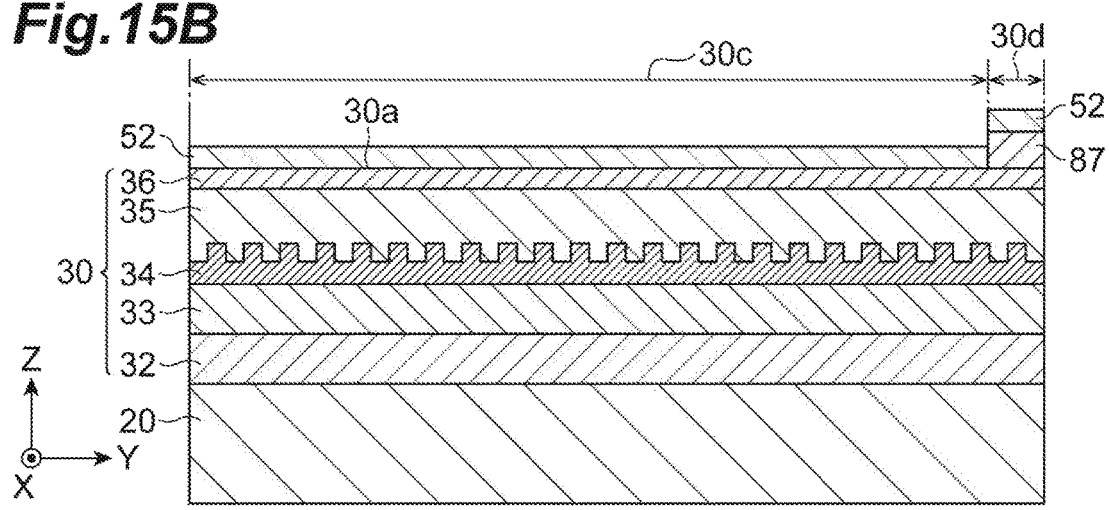
FIG. 15B is a schematic view showing a major process in the method according to still another embodiment.
Figure 15C:
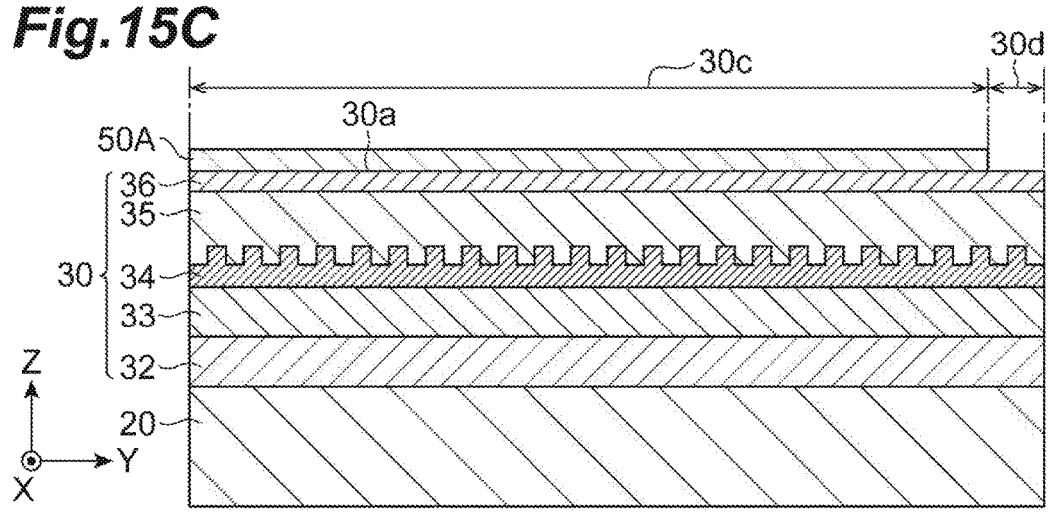
FIG. 15C is a schematic view showing a major process in the method according to still another embodiment.

In fabricating the quantum cascade laser 1B, after the third crystal growth step (shown in FIG. 5C) of forming the two current block portions 40 according to the above embodiment, the following process can be carried out. FIGS. 15A to 15C are schematic cross sectional views, each taken along a plane parallel to the YZ plane, showing a process of fabricating the quantum cascade laser 1D shown in FIG. 14. The cross sections in FIGS. 15A to 15C each show the semiconductor laminate 30 of the quantum cascade laser 1B. As shown in FIG. 15A, resist is patterned to form a resist mask 87 with a pattern, which covers the second upper area 30d. Next, as shown in FIG. 15B, a metal film 52 is formed on the upper electrode 50A for the first upper area 30c and the resist mask 87, for example, by vapor deposition. As shown in FIG. 15C, the deposition of the metal film 52 is followed by lifting-off which simultaneously removes the resist mask 87 and the deposited material of the metal film 52 thereon, thereby forming the upper electrode 50A on the upper face 30a. Thereafter, the insulating film 75 is deposited on the upper electrode 50A in the same manner (FIGS. 6A and 6B) as the above embodiment.

(Second Modification)

FIG. 16 is a perspective view showing the quantum cascade laser 1C according to the second modification of the embodiment. FIG. 16 is a cross-sectional view, taken along a plane parallel to the YZ-plane in the present embodiment, showing the semiconductor laminate 30. The quantum cascade laser 1C is different from the quantum cascade laser according to the above embodiment in the thickness of the second insulating film. Specifically, the insulating film 75A is disposed on the upper electrode 50, and includes a portion having a thickness larger than that of the remaining portion thereof. The insulating film 75A is provided with a first portion 75a and a second portion 75b, which is disposed between the first portion 75a and the rear end face 10a in the Y direction, and the first and second portion 75a and 75b are arranged in the direction of the rear end face 10b to the rear end face 10a, e.g., in the Y direction. In the present embodiment, the second portion 75b extends from the rear end face 10a, and the first portion 75a extends from the second portion 75b toward the front end portion 10b. The insulating film 75A has a first thickness in the first portion 75a and a second thickness in the second portion 75b, and the first and second thicknesses are measured in the Z direction. The first thickness is larger than the second thickness and can range from 200 to 400 nm, and the range of 300 to 400 nm is better than the above range. The first portion 75a is raised above the second portion 75b in the Z direction, and protrudes in the direction normal to the metal film 72 on the upper electrode 50.

The second portion 75b is disposed between the upper electrode 50 and the insulating film 71, and has a thickness in the Z direction, which is the same as that of the insulating film 75 according to the above embodiment. The insulating film 71 and metal film 72 on the upper electrode 50 have respective ends on the insulating film 75A, and are disposed on not the first portion 75a but the second portion 75b.

The insulating film 75A has a stepped portion 75c (a difference in level) at the boundary between the first and second portions 75a and 75b. The stepped portion 75c extends in the direction intersecting the Y direction, for example, at a right angle, and has a side, which is oriented toward ends of the insulating and metal films 71 and 72 on the second portion 75b. Providing the insulating film 75A with the stepped portion 75c allows the stepped portion 75c to bounce back particles in the flux for the metal film 72 in depositing the metal film 72 on the rear end 10a, thereby preventing the flux from flying over the stepped portion 75c. The stepped portion 75c hinders the metal film 72 from extending beyond the stepped portion 75c, thereby terminating the metal film 72 thereat. This termination of the metal film 72 avoids short-circuit between the metal film 72 and the upper electrode 50, thereby reducing the occurrence of the short-circuit failure in the quantum cascade laser 1C.

Figure 17A:
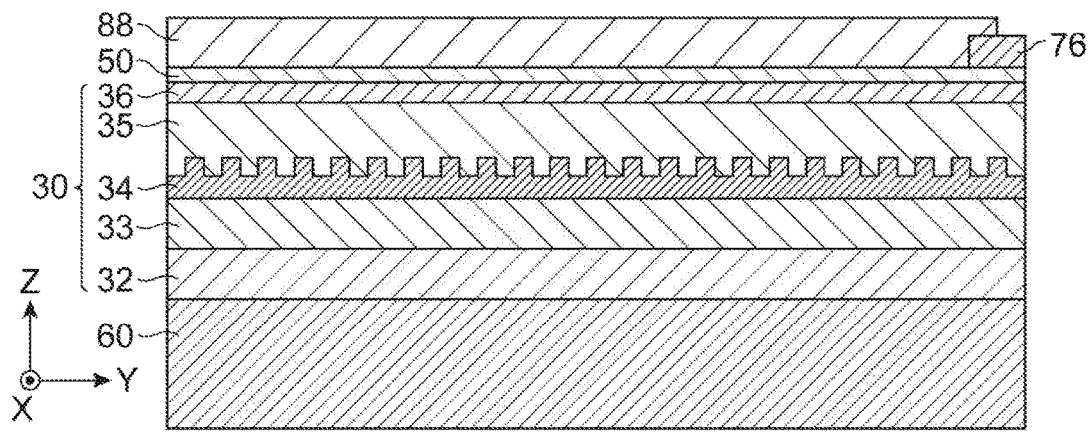
FIG. 17A is a schematic view showing a major process in the method according to still another embodiment.
Figure 17B:
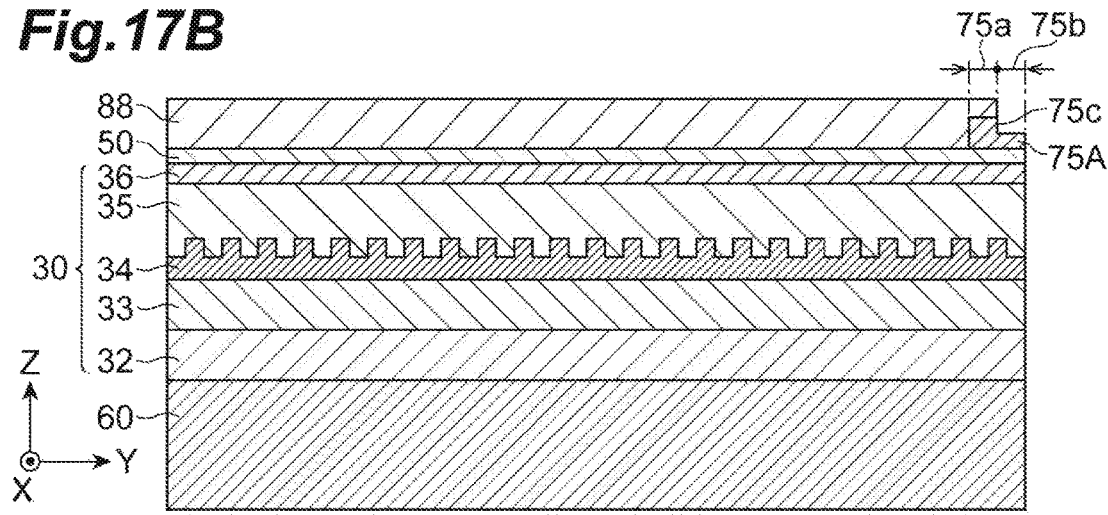
FIG. 17B is a schematic view showing a major process in the method according to still another embodiment.
Figure 17C:
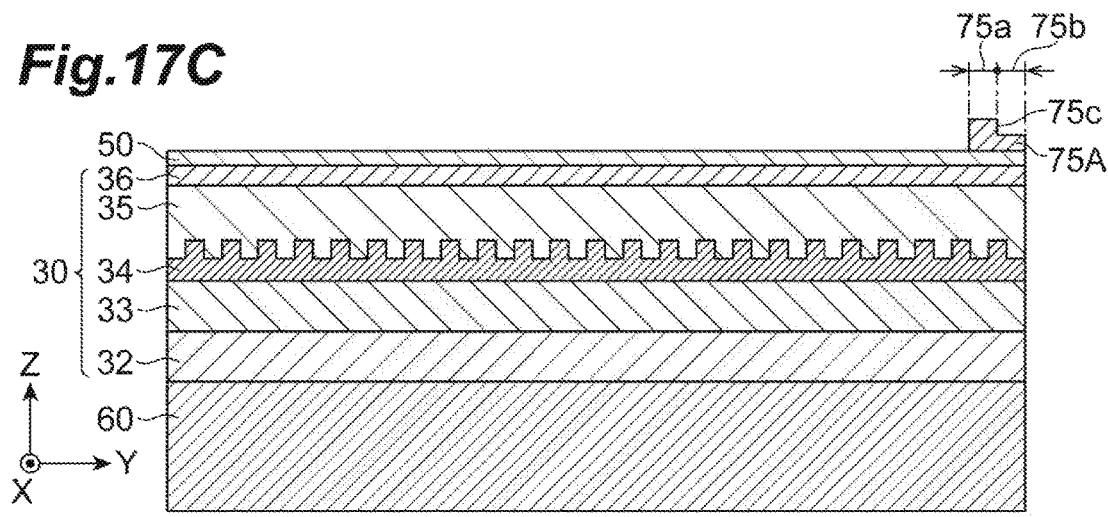
FIG. 17C is a schematic view showing a major process in the method according to still another embodiment.

Subsequently, a description will be given of a method for fabricating the quantum cascade laser 1C according to the present modification. This method has a former part, which has the same processes as those ranging from the beginning of the method according to the above embedment to the process for forming the insulating film 76 on the upper electrode 50 (with reference to FIG. 6C), and a latter part. The latter part follows the former part. In the latter part, the insulating film 76 is formed on the upper electrode 50, and has the same thickness as that of the first portion 75a. FIGS. 17A to 17C are schematic views each showing a major step in the method for fabricating the quantum cascade laser 1C. As shown in FIG. 17A, a resist film is formed on the upper electrode 50 and then is patterned to form a resist mask 88 on the insulating film 76. The resist mask 88 has an opening defining the second portion 75b and has a pattern covering the insulating film 76 to define the first portion 75a. The application of etching to the insulating film 76 with the mask 88 forms the insulating film 75A on the upper electrode 50 as shown in FIG. 17B. After the etching, the mask 88 is removed. The remaining process steps may be the same as those in the above embodiment.

The quantum cascade semiconductor laser of the present invention is not limited to the above-described quantum cascade semiconductor lasers, and other modifications are possible. For example, the above-described embodiment and each of the modifications may be combined with each other in accordance with purposes and effects according to the above-described embodiments. The insulating film and the metal film are disposed on the rear end face of the semiconductor device in the above-described embodiments and modifications, but the insulating film and the metal film may be disposed on the front end face or on both the front and rear end faces of the semiconductor device. The quantum cascade laser according to the above-described embodiments and modifications each have a buried-hetero structure, and if needed, has another structure, such as a high mesa structure with an insulating film (for example, a dielectric film, such as $SiO_2$) formed on both side faces of the semiconductor laminate 30. The above-described embodiments and modifications each have a DFB quantum cascade laser with the diffraction grating layer 34, but the present invention is not limited thereto. Similarly, the above-described embodiments and modifications can be provided with, for example, a Fabry-Perot (FP) type for a quantum cascade laser without the diffraction grating layer 34. The FP-type quantum cascade laser has the same improvement as the DFB type quantum cascade laser. The quantum cascade laser according to the above-described embodiments and modifications includes an upper electrode working as the cathode electrode, and a lower electrode working as the anode electrode. If needed, the quantum cascade laser according to the above-described embodiments and modifications may include the upper electrode working as the anode electrode and the lower electrode working as the cathode electrode as well. This quantum cascade laser has the same effects as the above-described embodiments and modifications.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. A quantum cascade laser comprising:
   a substrate including a principal surface, a back surface, and a substrate end face, the principal surface and the back surface being arranged in a first direction, the principal surface being opposite to the back surface, the substrate end face extending along a reference plane intersecting a second direction, and the second direction intersecting the first direction;
   a semiconductor laminate disposed on the principal surface of the substrate, the semiconductor laminate having a laminate end face, and the semiconductor laminate including a core layer extending from the laminate end face in the second direction, and a cladding layer disposed on the core layer, and the laminate end face extending along the reference plane;
   a first electrode disposed on the semiconductor laminate, the semiconductor laminate being disposed between the first electrode and the substrate;
   a second electrode disposed on the back surface of the substrate;
   a first insulating film disposed on the laminate end face, the substrate end face, and the first electrode;
   a metal film disposed on the first insulating film, on the laminate end face, on the substrate end face, and on the first electrode; and
   a second insulating film disposed on the first electrode, the second insulating film having a part on the first electrode, and the part of the second insulating film being between the metal film and the semiconductor laminate,
   on the first electrode, the second insulating film having a thickness in the first direction larger than that of the first insulating film.

2. The quantum cascade laser according to claim 1, wherein
   the principal surface has a first area and a second area,
   the first area and the second area of the principal surface are arranged in the second direction,
   the second area of the principal surface is disposed between the laminate end face and the first area of the principal surface,
   the first electrode has a first thickness on the first area of the principal surface and a second thickness on the second area of the principal surface, and
   in the first electrode, the second thickness is smaller than the first thickness.

3. The quantum cascade laser according to claim 1, wherein
   the principal surface has a first area and a second area,
   the first area and the second area of the principal surface are arranged in the second direction,
   the second area of the principal surface is disposed between the laminate end face and the first area of the principal surface, and
   the first electrode has an end apart from the laminate end face and the second area of the principal surface.

4. The quantum cascade laser according to claim 2, wherein
   the back surface has a first area and a second area,
   the first area and the second area of the back surface are arranged in the second direction,
   the second area of the back surface is disposed between the substrate end face and the first area of the back surface,
   the second electrode has a first thickness on the first area of the back surface and a second thickness on the second area of the back surface, and
   in the second electrode, the second thickness is smaller than the first thickness.

5. The quantum cascade laser according to claim 2, wherein
the back surface has a first area and a second area,
the first area and the second area of the back surface are arranged in the second direction,
the second area of the back surface is disposed between the substrate end face and the first area of the back surface, and
the second electrode has an end apart from the substrate end face and the second area of the back surface.

6. The quantum cascade laser according to claim 3, wherein
the back surface has a first area and a second area,
the first area and the second area of the back surface are arranged in the second direction,
the second area of the back surface is disposed between the substrate end face and the first area of the back surface, and
the second electrode has an end apart from the substrate end face and the second area of the back surface.

7. The quantum cascade laser according to claim 1, wherein
the second insulating film includes a first portion and a second portion arranged in the second direction, the second portion extends from the laminate end face to the first portion of the second insulating film,
the second insulating film has a first thickness in the first portion thereof and a second thickness in the second portion thereof, and
in the second insulating film, the first thickness is larger than the second thickness.

8. The quantum cascade laser according to claim 1, wherein at least one of the first insulating film and the second insulating film includes at least one of $SiO_2$, SiON, SiN, alumina, a BCB resin, or a polyimide resin.

9. The quantum cascade laser according to claim 1, wherein the metal film includes an Au film.

* * * * *